(12) United States Patent
Tsutsumi et al.

(10) Patent No.: US 11,698,306 B2
(45) Date of Patent: Jul. 11, 2023

(54) DIGITAL-OUTPUT TEMPERATURE SENSOR, CIRCUIT DEVICE, AND OSCILLATOR

(71) Applicant: Seiko Epson Corporation, Tokyo (JP)

(72) Inventors: Akio Tsutsumi, Chino (JP); Hideo Haneda, Shiojiri (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/680,680

(22) Filed: Feb. 25, 2022

(65) Prior Publication Data

US 2022/0276100 A1 Sep. 1, 2022

(30) Foreign Application Priority Data

Feb. 26, 2021 (JP) ................... 2021-029711

(51) Int. Cl.
    *G01K 7/01* (2006.01)
    *H03M 1/00* (2006.01)
    *H03B 5/04* (2006.01)

(52) U.S. Cl.
    CPC .......... *G01K 7/01* (2013.01); *H03B 5/04* (2013.01); *H03M 1/001* (2013.01)

(58) Field of Classification Search
    CPC ........................................... G01K 7/01
    USPC ............................................. 331/66
    See application file for complete search history.

(56) References Cited

U.S. PATENT DOCUMENTS

| 9,261,415 B1 * | 2/2016 | Zhang ................. G05F 3/16 |
| 2008/0095213 A1 * | 4/2008 | Lin ..................... G01K 7/015 |
| | | 374/170 |
| 2011/0200070 A1 | 8/2011 | Makinwa et al. |
| 2016/0238464 A1 * | 8/2016 | Eberlein ............ G01K 15/00 |
| 2018/0149526 A1 * | 5/2018 | Abughazaleh ...... G01K 7/16 |
| 2018/0328792 A1 * | 11/2018 | Zhu ..................... G01K 7/34 |
| 2021/0164843 A1 * | 6/2021 | Michel ................ H03M 1/066 |

OTHER PUBLICATIONS

S. H. Shalmany, K. Souri, U. Sonmez, K. Souri, M. D'Urbino, S. Hussaini, D. Tauro and S. Tabatabaei, "A 620uW BJT-Based Temperature-to-Digital Converter with 0.65mK Resolution and FoM of 190fJK2," ISSCC, pp. 70-71, Feb. 2020.

* cited by examiner

*Primary Examiner* — Joseph Chang
(74) *Attorney, Agent, or Firm* — Harness, Dickey & Pierce, P.L.C.

(57) ABSTRACT

The digital-output temperature sensor includes a temperature sensor circuit, a current mirror circuit which makes a mirror current of a temperature detection current flow and pulls in a mirror current of a reference current to thereby output a first difference current from a first output node and output a second difference current from a second output node, a chopping circuit, and an A/D conversion circuit. The chopping circuit performs a chopping operation of making the mirror current of the reference current flow in a second state through a transistor of the current mirror circuit through which the mirror current of the temperature detection current flows in a first state, and making the mirror current of the temperature detection current flow in the second state through the transistor of the current mirror circuit through which the mirror current of the reference current flows in the first state.

11 Claims, 24 Drawing Sheets

FIG. 6

| | | | | |
|---|---|---|---|---|
| φ1<br>fcp1=24kHz | SC1 | SC2 | SC1 | SC2 |
| φ2<br>fcp2=12kHz | SK1 | SK1 | SK2 | SK2 |
| S1A | ON | OFF | ON | OFF |
| S1B | OFF | ON | OFF | ON |
| S2A | ON | OFF | ON | OFF |
| S2B | OFF | ON | OFF | ON |
| S3A | ON | ON | OFF | OFF |
| S3B | OFF | OFF | ON | ON |
| S4A | ON | ON | OFF | OFF |
| S4B | OFF | OFF | ON | ON |

DIGITAL-OUTPUT TEMPERATURE SENSOR, CIRCUIT DEVICE, AND OSCILLATOR

The present application is based on, and claims priority from JP Application Serial Number 2021-029711, filed Feb. 26, 2021, the disclosure of which is hereby incorporated by reference herein in its entirety.

BACKGROUND

1. Technical Field

The present disclosure relates to a digital-output temperature sensor, a circuit device, an oscillator, and so on.

2. Related Art

In the past, there has been known a digital-output temperature sensor which outputs a temperature detection result of a temperature sensor circuit. For example, in "S. H. Shalmany, K. Souri, U. Sonmez, K. Souri, M. D'Urbino, S. Hussaini, D. Tauro, and S. Tabatabaei, "A 620 uW BJT-Based Temperature-to-Digital Converter with 0.65 mK Resolution and FoM of 190fJK2," ISSCC, pp. 70-71, February 2020" (Document 1), there is disclosed a configuration in which a delta-sigma type A/D conversion circuit is combined with a current type temperature sensor.

In the configuration in Document 1, an amplifier circuit is used inside, and there is potentially provided a source of generation of a 1/f noise, and therefore, there is a problem that the level of the low-frequency noise is high.

SUMMARY

An aspect of the present disclosure relates to a digital-output temperature sensor including a temperature sensor circuit configured to detect temperature to output a temperature detection current, a current mirror circuit which is configured to make a mirror current of the temperature detection current flow into a first output node as a source current, and pull in a mirror current of a reference current from the first output node as a sink current to thereby output a first difference current from the first output node, and which is configured to make the mirror current of the reference current flow into a second output node as the source current, and pull in the mirror current of the temperature detection current from the second output node as the sink current to thereby output a second difference current from the second output node, a chopping circuit configured to perform a chopping operation on a transistor of the current mirror circuit, and an A/D conversion circuit configured to perform an A/D conversion of the first difference current and the second difference current as a differential pair, wherein the chopping circuit is configured to perform the chopping operation of making the mirror current of the reference current flow in a second state through the transistor of the current mirror circuit through which the mirror current of the temperature detection current flows in a first state, and making the mirror current of the temperature detection current flow in the second state through the transistor of the current mirror circuit through which the mirror current of the reference current flows in the first state.

Further, another aspect of the present disclosure relates to a circuit device including the digital-output temperature sensor described above, and an oscillation circuit configured to oscillate a resonator, wherein the digital-output temperature sensor detects ambient temperature of the resonator to output ADC result data as the temperature detection data.

Further, another aspect of the present disclosure relates to an oscillator including the circuit device described above, and the resonator.

BRIEF DESCRIPTION OF THE DRAWINGS

FIG. 6 is an explanatory diagram of the chopping operation of the current mirror circuit.

DESCRIPTION OF AN EXEMPLARY EMBODIMENT

The present embodiment will hereinafter be described. It should be noted that the present embodiment described below does not unreasonably limit the contents set forth in the appended claims. Further, all of the constituents described in the present embodiment are not necessarily essential elements.

1. Digital-Output Temperature Sensor

Figure 1:
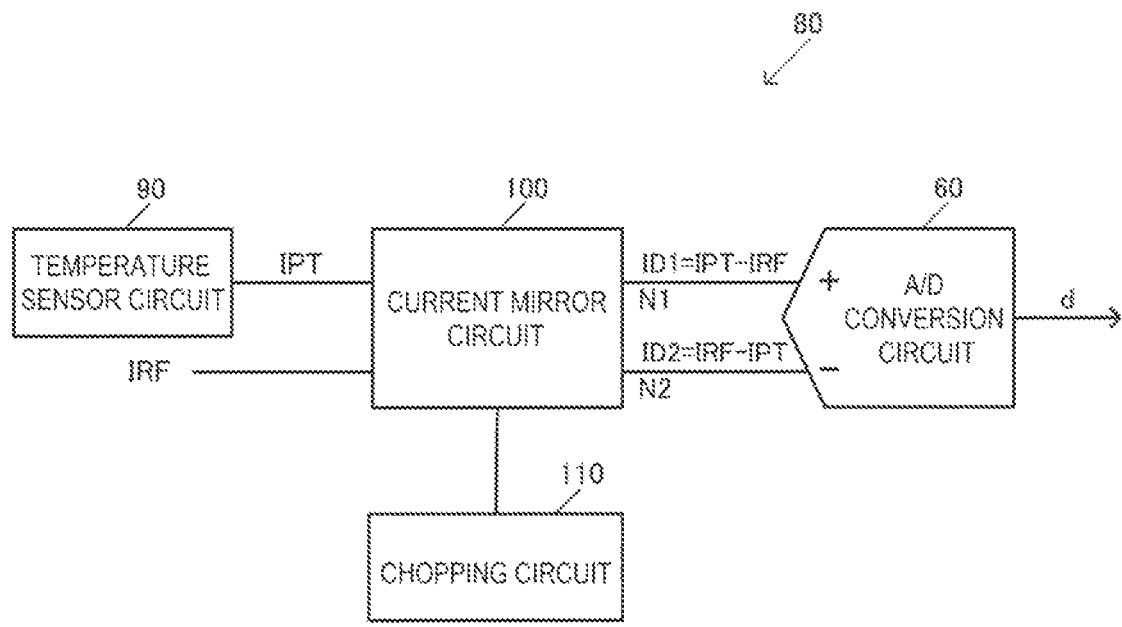
FIG. 1 is a diagram showing a configuration example of a digital-output temperature sensor according to the embodiment.

FIG. 1 shows a configuration example of a digital-output temperature sensor 80 according to the present embodiment. The digital-output temperature sensor 80 includes a temperature sensor circuit 90, a current mirror circuit 100, a chopping circuit 110, and an A/D conversion circuit 60. It should be noted that the digital-output temperature sensor 80 according to the present embodiment is not limited to the configuration shown in FIG. 1, but there can be adopted a variety of practical modifications such as elimination of some of the constituents, addition of other constituents, or replacement of the constituents with different types of constituents.

The temperature sensor circuit 90 is a sensor circuit for detecting the temperature. Specifically, the temperature sensor circuit 90 detects the temperature to output a temperature detection current IPT. For example, the temperature sensor circuit 90 outputs a temperature-dependent voltage which varies in accordance with the environmental temperature as the temperature detection current IPT which is temperature detection information. For example, the temperature sensor circuit 90 generates the temperature detection current using a circuit element having the temperature dependency. Specifically, the temperature sensor circuit 90 uses the temperature dependency provided to a forward voltage of a PN junction to thereby output the temperature detection current IPT having a current value varying dependently on the temperature. For example, the temperature sensor circuit 90 outputs the temperature detection current IPT having a positive or negative temperature characteristic. It should be noted that as the forward voltage of the PN junction, there can be used, for example, a base-emitter voltage of a bipolar transistor.

The current mirror circuit 100 performs a current mirror operation of mirroring the temperature detection current IPT from the temperature sensor circuit 90 and a reference current IRF to output difference currents ID1, ID2. The difference current ID1 is a first difference current, and the difference current ID2 is a second difference current. The difference current ID1 can be expressed as, for example, ID1=IPT-IRF, and is, for example, a difference current of a positive polarity side. The difference current ID2 can be expressed as, for example, ID2=IRF-IPT, and is, for example, a difference current of a negative polarity side. These difference currents ID1, ID2 are input to the A/D conversion circuit 60 having differential input to differentially be amplified. The reference current IRF is a current which becomes a norm when, for example, the A/D conversion circuit 60 performs the differential amplification.

Specifically, the current mirror circuit 100 makes the mirror current of the temperature detection current IPT flow into an output node N1 as a source current, and pulls in the mirror current of the reference current IRF from the output node N1 as a sink current to thereby output ID1=IPT-IRF as the first difference current from the output node N1. Further, the current mirror circuit 100 makes the mirror current of the reference current IRF flow into an output node N2 as a source current, and pulls in the mirror current of the temperature detection current IPT from the output node N2 as a sink current to thereby output ID2=IRF-IPT as the second difference current from the output node N2. The output node N1 is a first output node of the current mirror circuit 100, and is, for example, an output node of the positive polarity side. The output node N2 is a second output node of the current mirror circuit 100, and is, for example, an output node of the negative polarity side. The mirror current of the temperature detection current IPT is a current obtained by mirroring the temperature detection current IPT, and the mirror current of the reference current IRF is a current obtained by mirroring the reference current IRF.

The chopping circuit 110 performs a chopping operation to transistors of the current mirror circuit 100. For example, the chopping circuit 110 performs the chopping operation to the transistors for mirroring the temperature detection current IPT and the reference current IRF in the current mirror circuit 100. For example, the chopping circuit 110 performs the chopping operation of switching coupling destinations of one ends of the transistors of the current mirror circuit 100 with switches.

The A/D conversion circuit 60 performs the A/D conversion of the difference currents ID1, ID2 as a differential pair. Further, for example, in the A/D conversion circuit 60, the first difference current ID1 is input to a first terminal as a differential input, the second difference current ID2 is input to a second terminal as a differential input, and differential amplification of the difference currents ID1, ID2 is performed to output ADC output digital values d. As the A/D conversion circuit 60, it is desirable to use, for example, a successive-approximation type A/D conversion circuit. In this case, it is sufficient to dispose a current/voltage conversion circuit at an anterior side of the successive-approximation type A/D conversion circuit. It should be noted that as the A/D conversion circuit 60, it is possible to use an A/D conversion circuit of another type than the successive-approximation type. For example, it is possible to use an A/D conversion circuit of another type than the successive-approximation type such as a pipeline type or a delta-sigma type.

Further, the chopping circuit 110 performs the chopping operation of making, in a second state, the mirror current of the reference current IRF flow through the transistor of the current mirror circuit 100 through which the mirror current of the temperature detection current IPT flows in a first state. Further, the chopping circuit 110 performs the chopping operation of making, in the second state, the mirror current of the temperature detection current IPT flow through the transistor of the current mirror circuit 100 through which the mirror current of the reference current IRF flows in the first state. In other words, when the mirror current of the temperature detection current IPT flows in the first state in the transistor as the chopping target of the current mirror circuit 100, the chopping circuit 110 performs the chopping operation of making the mirror current of the reference current IRF flow through the transistor in the second state. Further, when the mirror current of the reference current IRF flows in the first state in the transistor as the chopping target, the chopping circuit 110 performs the chopping operation of making the mirror current of the temperature detection current IPT flow through the transistor in the second state.

As described above, in the present embodiment, the temperature sensor circuit 90 detects the temperature to output the temperature detection result as the temperature detection current IPT. In other words, the temperature detection current IPT having the temperature dependency is input from the temperature sensor circuit 90 to the current mirror circuit 100. Further, the reference current IRF which does not have temperature dependency, for example, is input to the current mirror circuit 100. Then, the current mirror circuit 100 performs the mirroring of the temperature detection current IPT and the reference current IRF to output the difference currents ID1, ID2 to the output nodes N1, N2, respectively, and then the A/D conversion circuit 60 performs the A/D conversion of the difference currents ID1, ID2. On this occasion, the chopping circuit 110 performs the chopping operation of making, in the second state, the mirror current of the reference current IRF flow through the transistor of the current mirror circuit 100 through which the mirror current of the temperature detection current IPT flows in the first state. Further, the chopping circuit 110 performs the chopping operation of making, in the second state, the mirror current of the temperature detection current IPT flow through the transistor of the current mirror circuit 100 through which the mirror current of the reference current IRF flows in the first state. In this way, it becomes to be arranged that in, for example, the transistor as the chopping target of the current mirror circuit 100, for example, the mirror current of the temperature detection current IPT flows in the first state, and the mirror current of the reference current IRF flows in the second state. Further, it becomes to be arranged that in the other transistor as the chopping target of the current mirror circuit 100, for example, the mirror current of the reference current IRF flows in the first state, and the mirror current of the temperature detection current IPT flows in the second state. Therefore, the modulation or the like of the chopping becomes to be performed by switching between the first state, the second state, and so on with the frequency of, for example, the chopping operation, and thus, it becomes possible to achieve reduction of noise.

For example, it is desired for the digital-output temperature sensor 80 to output a high-accuracy temperature detection result, and to that end, it is necessary to decrease the influence of the noise as much as possible. In particular in the digital-output temperature sensor 80, it is desired that the noise in a low frequency band can be reduced. However, since the transistors constituting the current mirror circuit 100 generate the 1/f noise, the 1/f noise becomes the principal noise of the digital-output temperature sensor 80 to hinder the digital-output temperature sensor 80 to become high-accuracy. In this regard, in the present embodiment, since the chopping operation is performed on the transistors of the current mirror circuit 100, there is performed a modulation of the chopping in which the noise such as the 1/f noise of the transistors is modulated into the chopping frequency as a high frequency. Further, since there is performed a demodulation of the chopping in which the difference currents ID1=IPT-IRF, ID2=IRF-IPT are properly output from the respective output nodes N1, N2 of the current mirror circuit 100 even when the switching between the first state and the second state occurs, the noise such as the 1/f noise of the current mirror circuit 100 is prevented from being transmitted to the A/D conversion circuit 60 in the posterior stage, and it becomes possible to achieve the reduction of noise of the digital-output temperature sensor 80.

Then, the chopping operation of the current mirror circuit 100 will specifically be described using FIG. 2 through FIG. 6. In FIG. 2 through FIG. 5 showing the configuration of the current mirror circuit 100, there is shown an example of a circuit configuration of an output stage portion of the current mirror circuit 100, and the current mirror circuit 100 includes the transistors T1, T2, T3, and T4. The transistors T1, T2, T3, and T4 are a first transistor, a second transistor, a third transistor, and a fourth transistor, respectively. Here, the transistors T1, T2 are, for example, MOS transistors. The MOS transistor is also called a MOSFET (Metal-Oxide-Semiconductor Field-Effect Transistor). Specifically, the transistors T1, T2 are P-type MOS transistors. On the other hand, the transistors T3, T4 are bipolar transistors. It should be noted that the present embodiment is not limited thereto, and it is possible to adopt a variety of modified implementations such as using bipolar transistors as the transistors T1, T2, or using N-type MOS transistors as the transistors T3, T4.

Further, the chopping circuit 110 performs at least one of a source side chopping operation as a chopping operation to the transistor for making the source current flow, and a sink side chopping operation as a chopping operation to the transistor for pulling in the sink current. For example, the chopping circuit 110 can perform either one of the source side chopping operation and the sink side chopping operation, or can perform both thereof.

Specifically, the chopping circuit 110 performs the source side chopping operation of switching between a source side first state and a source side second state, wherein in the source side first state, the transistor T1 makes the mirror current of the temperature detection current IPT flow as the source current, and the transistor T2 makes the mirror current of the reference current IRF flow as the source current, and in the source side second state, the transistor T1 makes the mirror current of the reference current IRF flow as the source current, and the transistor T2 makes the mirror current of the temperature detection current IPT flow as the source current. Further, the chopping circuit 110 performs a sink side chopping operation of switching between a sink side first state and a sink side second state, wherein in the sink side first state, the transistor T3 pulls in the mirror current of the reference current IRF, and the transistor T4 pulls in the mirror current of the temperature detection current IPT, and in the sink side second state, the transistor T3 pulls in the mirror current of the temperature detection current IPT, and the transistor T4 pulls in the mirror current of the reference current IRF.

For example, in FIG. 2 through FIG. 6, the symbol φ1 denotes a chopping control signal for switching between the source side chopping operations, and the symbol φ2 denotes a chopping control signal for switching between the sink side chopping operations. In other words, as shown in FIG. 6, the source side first state SC1 and the source side second state SC2 are switched by the chopping control signal φ1. Further, the sink side first state SK1 and the sink side second state SK2 are switched by the chopping control signal φ2. Here, the chopping control signals φ1, φ2 are each a signal an active level of which is an L level, and an inactive level of which is an H level.

As shown in FIG. 2 through FIG. 5, the chopping circuit 110 includes switches S1A, S1B, S2A, S2B, S3A, S3B, S4A, and S4B. These switches can be realized by, for example, MOS transistors. Further, the switches S1A, S1B, S2A, and S2B are set to an ON state or an OFF state by the chopping control signals φ1, Xφ1 at the source side, and the switches S3A, S3B, S4A, and S4B are set to an ON state or an OFF state by the chopping control signals φ2, Xφ2 at the sink side. It should be noted that the chopping control signals φ1, φ2 are positive logic signals, and the chopping control signals Xφ1, Xφ2 are negative logic signals.

Figure 2:
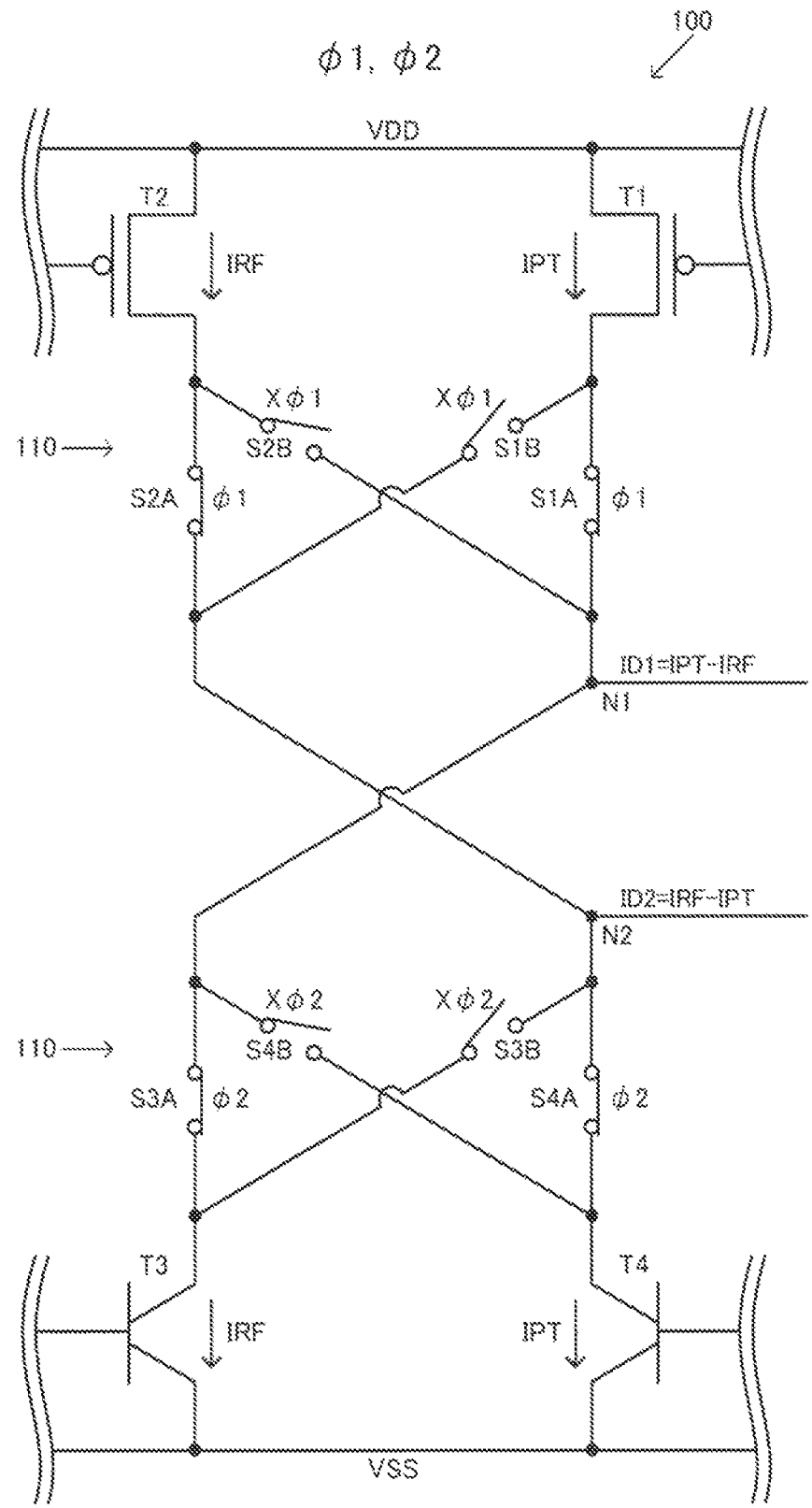
FIG. 2 is an explanatory diagram of a chopping operation of a current mirror circuit.

For example, FIG. 2 shows the state when both of the chopping control signals φ1, φ2 are active. As shown in FIG. 2 and FIG. 6, in the source side first state SC1 in which the chopping control signal φ1 becomes active, the switches S1A, S2A of the chopping circuit 110 are set to the ON state, and the switches S1B, S2B are set to the OFF state. Further, in the sink side first state SK1 in which the chopping control signal φ2 becomes active, the switches S3A, S4A of the chopping circuit 110 are set to the ON state, and the switches S3B, S4B are set to the OFF state.

As described above, in the source side first state SC1 and the sink side first state SK1 in which both of the chopping control signals φ1, φ2 are active, the mirror current of the temperature detection current IPT in the transistor T1 flows into, for example, the output node N1 as the source current via the switch S1A set to the ON state as shown in FIG. 2. Further, the mirror current of the reference current IRF in the transistor T3 is pulled in from, for example, the output node N1 as the sink current via the switch S3A set to the ON state. Thus, the difference current ID1=IPT−IRF becomes to be output from the output node N1. Further, the mirror current of the reference current IRF in the transistor T2 flows into, for example, the output node N2 as the source current via the switch S2A set to the ON state. Further, the mirror current of the temperature detection current IPT in the transistor T4 is pulled in from, for example, the output node N2 as the sink current via the switch S4A set to the ON state. Thus, the difference current ID2=IRF-IPT becomes to be output from the output node N2.

Figure 3:
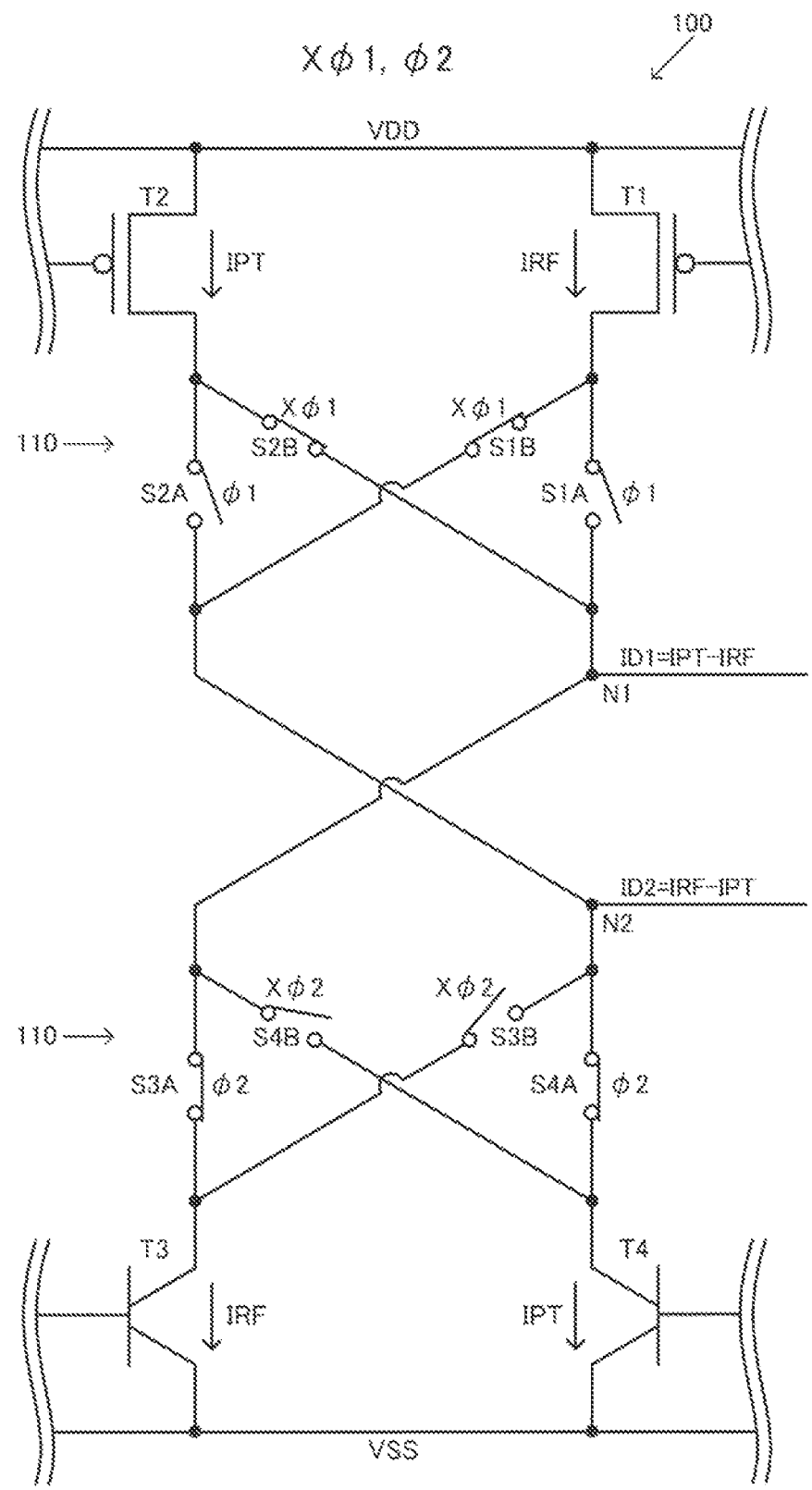
FIG. 3 is an explanatory diagram of the chopping operation of the current mirror circuit.

Further, FIG. 3 shows the state when the chopping control signal φ1 is inactive, and the chopping control signal φ2 is active. The expression that the chopping control signal φ1 is inactive means that the chopping control signal Xφ1 as the negative logic signal becomes active. As shown in FIG. 3 and FIG. 6, in the source side second state SC2 in which the chopping control signal φ1 becomes inactive, the switches S1A, S2A are set to the OFF state, and the switches S1B, S2B are set to the ON state. Further, in the sink side first state SK1 in which the chopping control signal φ2 becomes active, the switches S3A, S4A are set to the ON state, and the switches S3B, S4B are set to the OFF state.

As described above, in the source side second state SC2 and the sink side first state SK1 in which the chopping control signal φ1 is inactive (the chopping control signal Xφ1 is active), and the chopping control signal φ2 is active, the mirror current of the temperature detection current IPT in the transistor T2 flows into, for example, the output node N1 as the source current via the switch S2B set to the ON state as shown in FIG. 3. Further, the mirror current of the reference current IRF in the transistor T3 is pulled in from, for example, the output node N1 as the sink current via the switch S3A set to the ON state. Thus, the difference current ID1=IPT-IRF becomes to be output from the output node N1. Further, the mirror current of the reference current IRF in the transistor T1 flows into, for example, the output node N2 as the source current via the switch S1B set to the ON state. Further, the mirror current of the temperature detection current IPT in the transistor T4 is pulled in from, for example, the output node N2 as the sink current via the switch S4A set to the ON state. Thus, the difference current ID2=IRF−IPT becomes to be output from the output node N2.

Figure 4:
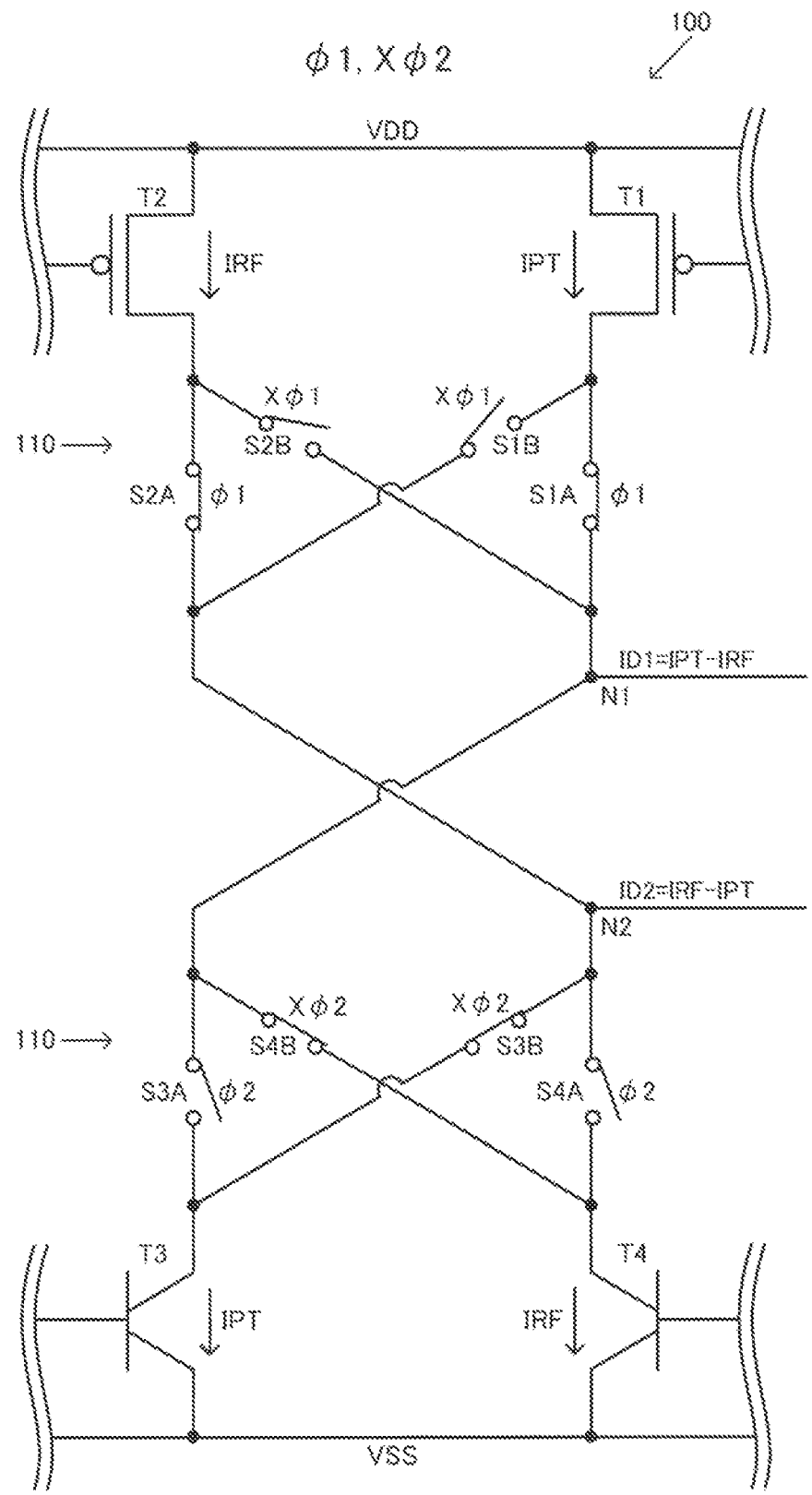
FIG. 4 is an explanatory diagram of the chopping operation of the current mirror circuit.

Further, FIG. 4 shows the state when the chopping control signal φ1 is active, and the chopping control signal φ2 is inactive. The expression that the chopping control signal φ2 is inactive means that the chopping control signal Xφ2 as the negative logic signal becomes active. As shown in FIG. 4 and FIG. 6, in the source side first state SC1 in which the chopping control signal φ1 becomes active, the switches S1A, S2A are set to the ON state, and the switches S1B, S2B are set to the OFF state. Further, in the sink side second state SK2 in which the chopping control signal φ2 becomes inactive, the switches S3A, S4A are set to the OFF state, and the switches S3B, S4B are set to the ON state.

As described above, in the source side first state SC1 and the sink side second state SK2 in which the chopping control signal φ1 is active, and the chopping control signal φ2 is inactive (the chopping control signal Xφ2 is active), the mirror current of the temperature detection current IPT in the transistor T1 flows into, for example, the output node N1 as the source current via the switch S1A set to the ON state as shown in FIG. 4. Further, the mirror current of the reference current IRF in the transistor T4 is pulled in from, for example, the output node N1 as the sink current via the switch S4B set to the ON state. Thus, the difference current ID1=IPT−IRF becomes to be output from the output node N1. Further, the mirror current of the reference current IRF in the transistor T2 flows into, for example, the output node N2 as the source current via the switch S2A set to the ON state. Further, the mirror current of the temperature detection current IPT in the transistor T3 is pulled in from, for example, the output node N2 as the sink current via the switch S3B set to the ON state. Thus, the difference current ID2=IRF-IPT becomes to be output from the output node N2.

Figure 5:
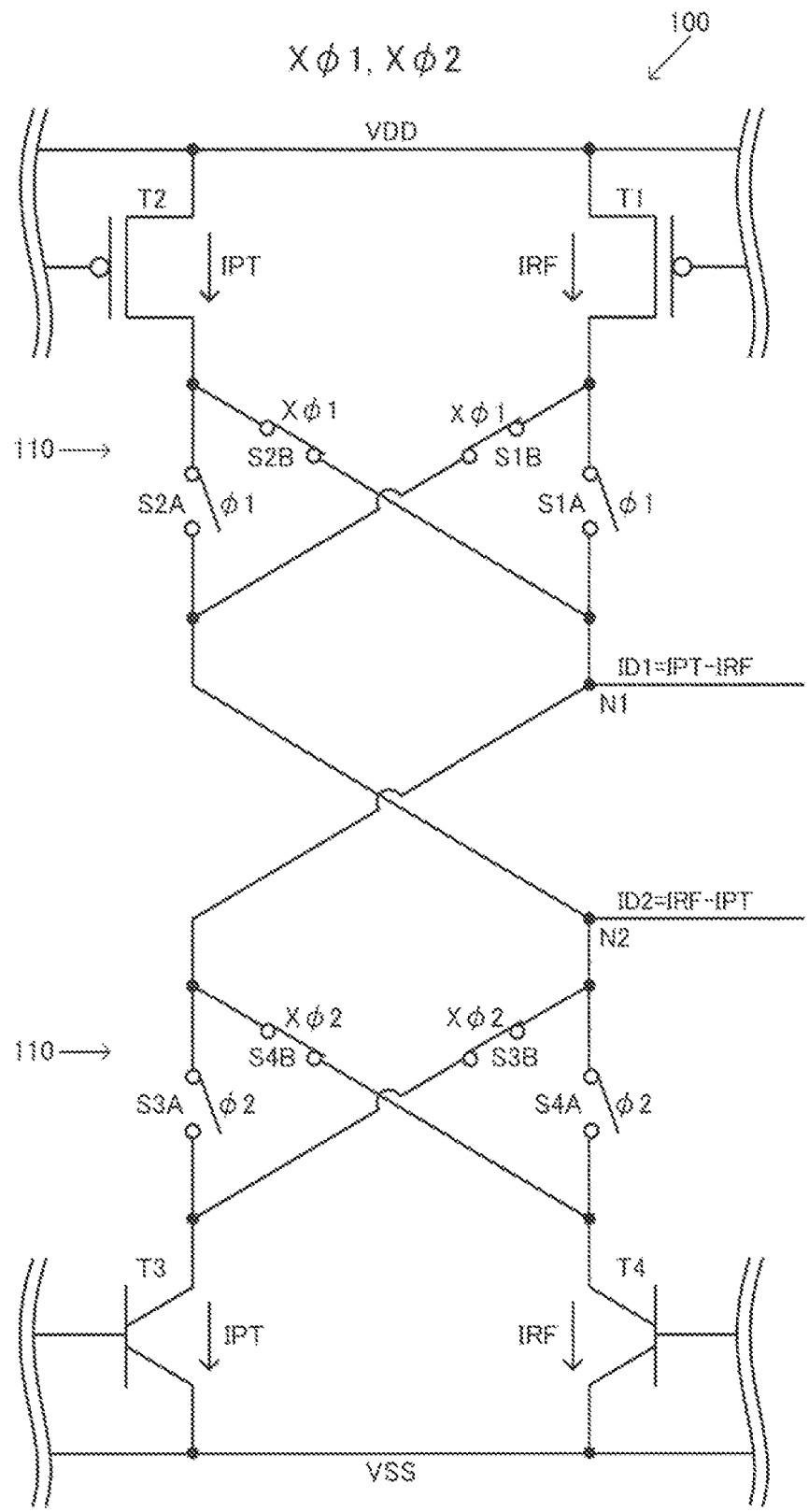
FIG. 5 is an explanatory diagram of the chopping operation of the current mirror circuit.

Further, FIG. 5 shows the state when both of the chopping control signals φ1, φ2 are inactive. As shown in FIG. 5 and FIG. 6, in the source side second state SC2 in which the chopping control signal φ1 becomes inactive, the switches S1A, S2A are set to the OFF state, and the switches S1B, S2B are set to the ON state. Further, in the sink side second state SK2 in which the chopping control signal φ2 becomes inactive, the switches S3A, S4A are set to the OFF state, and the switches S3B, S4B are set to the ON state.

As described above, in the source side second state SC2 and the sink side second state SK2 in which both of the chopping control signals φ1, φ2 are inactive (the chopping control signals Xφ1, Xφ2 are active), the mirror current of the temperature detection current IPT in the transistor T2 flows into, for example, the output node N1 as the source current via the switch S2B set to the ON state as shown in FIG. 5. Further, the mirror current of the reference current IRF in the transistor T4 is pulled in from, for example, the output node N1 as the sink current via the switch S4B set to the ON state. Thus, the difference current ID1=IPT−IRF becomes to be output from the output node N1. Further, the mirror current of the reference current IRF in the transistor T1 flows into, for example, the output node N2 as the source current via the switch S1B set to the ON state. Further, the mirror current of the temperature detection current IPT in the transistor T3 is pulled in from, for example, the output node N2 as the sink current via the switch S3B set to the ON state. Thus, the difference current ID2=IRF−IPT becomes to be output from the output node N2.

As described above, in the present embodiment, the chopping circuit 110 performs the source side chopping operation of switching between the source side first state SC1 shown in FIG. 2 and FIG. 4 and the source side second state SC2 shown in FIG. 3 and FIG. 5 using the chopping control signal φ1 at the source side. Specifically, in the source side first state SC1 shown in FIG. 2 and FIG. 4, the transistor T1 makes the mirror current of the temperature detection current IPT flow as the source current, and the transistor T2 makes the mirror current of the reference current IRF flow as the source current. On the other hand, in the source side second state SC2 shown in FIG. 3 and FIG. 5, the transistor T1 makes the mirror current of the reference current IRF flow as the source current, and the transistor T2 makes the mirror current of the temperature detection current IPT flow as the source current. As described above, due to the source side chopping operation of switching between the source side first state SC1 and the source side second state SC2, the transistor for making the temperature detection current IPT flow and the transistor for making the reference current IRF flow become to be switched alternately. Thus, the noise such as the 1/f noise generated in the transistors T1, T2 at the source side becomes to be modulated into the chopping frequency as the high frequency of the chopping control signal φ1, and the noise is prevented from being transmitted to the A/D conversion circuit 60 in the posterior stage, and it becomes possible to realize the high-accuracy digital-output temperature sensor 80.

Further, in the present embodiment, the chopping circuit 110 performs the sink side chopping operation of switching between the sink side first state SK1 shown in FIG. 2 and FIG. 3 and the sink side second state SK2 shown in FIG. 4 and FIG. 5 using the chopping control signal φ2 at the sink side. Specifically, in the sink side first state SK1 shown in FIG. 2 and FIG. 3, the transistor T3 pulls in the mirror current of the reference current IRF as the sink current, and the transistor T4 pulls in the mirror current of the temperature detection current IPT as the sink current. On the other hand, in the sink side second state SK2 shown in FIG. 4 and FIG. 5, the transistor T3 pulls in the mirror current of the temperature detection current IPT as the sink current, and the transistor T4 pulls in the mirror current of the reference current IRF as the sink current. As described above, due to the sink side chopping operation of switching between the sink side first state SK1 and the sink side second state SK2, the transistor for pulling in the temperature detection current IPT and the transistor for pulling in the reference current IRF become to be switched alternately. Thus, the noise such as the 1/f noise generated in the transistors T3, T4 at the sink side becomes to be modulated into the chopping frequency as the high frequency of the chopping control signal φ2, and the noise is prevented from being transmitted to the A/D conversion circuit 60 in the posterior stage, and it becomes possible to realize the high-accuracy digital-output temperature sensor 80.

Further, in the present embodiment, when the chopping circuit 110 performs the source side chopping operation and the sink side chopping operation, a relationship of fcp1=m×fcp2, or m×fcp1=fcp2 becomes true defining the frequency of the source side chopping operation as fcp1, the frequency of the sink side chopping operation as fcp2, and m as an integer no smaller than 2. For example, in FIG. 6, fcp1=24 kHz, fcp2=12 kHz are assumed, and thus, the relationship of fcp1=m×fcp2=2×fcp2 is true. In this case, it is possible to further increase the frequency of fcp1 to make fcp1≥3×fcp2 true. In other words, it is sufficient for the relationship of fcp1=m×fcp2 to be made true assuming m as an integer no smaller than 2. Alternatively, it is possible to arrange that the frequency fcp2 of the sink side chopping operation becomes higher than the frequency fcp1 of the source side chopping operation on the contrary. In other words, it is possible for the relationship of fcp2=m×fcp1 to be made true assuming m as an integer no smaller than 2. By the relationship of fcp1=m×fcp2 or m×fcp1=fcp2 being fulfilled as described above, it becomes possible to realize the chopping operation of making the temperature detection current IPT and the reference current IRF flow while switching between the temperature detection current IPT and the reference current IRF using a variety of combinations of the transistors for making the source current flow and the transistors for pulling in the sink current as shown in FIG. 2 through FIG. 6. For example, in FIG. 2, there is formed the combination in which the temperature detection current IPT flows through the transistor T1 at the source side, the reference current IRF flows through the transistor T2, the reference current IRF flows through the transistor T3 at the sink side, and the temperature detection current IPT flows through the transistor T4. In FIG. 3, there is formed the combination in which the reference current IRF flows through the transistor T1 at the source side, the temperature detection current IPT flows through the transistor T2, the reference current IRF flows through the transistor T3 at the sink side, and the temperature detection current IPT flows through the transistor T4. Further, in FIG. 4, there is formed the combination in which the temperature detection current IPT flows through the transistor T1 at the source side, the reference current IRF flows through the transistor T2, the temperature detection current IPT flows through the transistor T3 at the sink side, and the reference current IRF flows through the transistor T4. In FIG. 5, there is formed the combination in which the reference current IRF flows through the transistor T1 at the source side, the temperature detection current IPT flows through the transistor T2, the temperature detection current IPT flows through the transistor T3 at the sink side, and the reference current IRF flows through the transistor T4. By the chopping operation of making the temperature detection current IPT and the reference current IRF flow while switching between the temperature detection current IPT and the reference current IRF being performed using the variety of combinations of the transistors at the source side and the drain side as described above, the low-frequency noise such as the 1/f noise generated by the transistors of the current mirror circuit 100 is further prevented from being transmitted to the A/D conversion circuit 60 in the posterior stage, and it becomes possible to realize a further increase in accuracy of the digital-output temperature sensor 80.

Further, the chopping circuit 110 performs the source side chopping operation of switching between the source side first state SC1 and the source side second state SC2, wherein in the source side first state SC1, the transistor T1 makes the mirror current of the temperature detection current IPT flow to the output node N1, and the transistor T2 makes the mirror current of the reference current IRF flow to the output node N2, and in the source side second state SC2, the transistor T1 makes the mirror current of the reference current IRF flow to the output node N2, and the transistor T2 makes the mirror current of the temperature detection current IPT flow to the output node N1. In other words, in the source side first state SC1 shown in FIG. 2 and FIG. 4, the transistor T1 makes the temperature detection current IPT flow to the output node N1, and the transistor T2 makes the reference current IRF flow to the output node N2, and in the source side second state SC2 shown in FIG. 3 and FIG. 5, the transistor T1 makes the reference current IRF flow to the output node N2, and the transistor T2 makes the temperature detection current IPT flow to the output node N1. In this way, it becomes to be arranged that the temperature detection current IPT flows to the output node N1 as the source current and the reference current IRF flows to the output node N2 as the source current in both of the source side first state SC1 shown in FIG. 2 and FIG. 4 and the source side second state SC2 shown in FIG. 3 and FIG. 5 when the modulation of switching the transistors for making the temperature detection current IPT and the reference current IRF flow is performed. Therefore, the modulation of chopping of switching the transistors at the source side for making the temperature detection current IPT and the reference current IRF flow, and the demodulation of chopping of outputting the proper difference currents ID1, ID2 from the output nodes N1, N2 become to be performed. Thus, the noise such as the 1/f noise generated by, for example, the transistors T1, T2 at the source side of the current mirror circuit 100 is prevented from being transmitted to the A/D conversion circuit 60 in the posterior stage, and it becomes possible to realize the high-accuracy digital-output temperature sensor 80.

Further, the chopping circuit 110 performs the sink side chopping operation of switching between the sink side first state SK1 and the sink side second state SK2, wherein in the sink side first state SK1, the transistor T3 pulls in the mirror current of the reference current IRF from the output node N1, and the transistor T4 pulls in the mirror current of the temperature detection current IPT from the output node N2, and in the sink side second state SK2, the transistor T3 pulls in the mirror current of the temperature detection current IPT from the output node N2, and the transistor T4 pulls in the mirror current of the reference current IRF from the output node N1. In other words, in the sink side first state SK1 shown in FIG. 2 and FIG. 3, the transistor T3 pulls in the reference current IRF from the output node N1, and the transistor T4 pulls in the temperature detection current IPT from the output node N2, and in the sink side second state SK2 shown in FIG. 4 and FIG. 5, the transistor T3 pulls in the temperature detection current IPT from the output node N2, and the transistor T4 pulls in the reference current IRF from the output node N1. In this way, it becomes to be arranged that the reference current IRF is pulled in from the output node N1 as the sink current, and the temperature detection current IPT is pulled in from the output node N2 as the sink current in both of the sink side first state SK1 shown in FIG. 2 and FIG. 3 and the sink side second state SK2 shown in FIG. 4 and FIG. 5 when the modulation of switching the sink side transistors for pulling in the reference current IRF and the temperature detection current IPT is performed. Therefore, the modulation of chopping of switching the transistors for making the reference current IRF and the temperature detection current IPT flow, and the demodulation of chopping of outputting the proper difference currents ID1, ID2 from the output nodes N1, N2 become to be performed. Thus, the noise such as the 1/f noise generated by, for example, the transistors at the sink side of the current mirror circuit 100 is prevented from being transmitted to the A/D conversion circuit 60 in the posterior stage, and it becomes possible to realize the high-accuracy digital-output temperature sensor 80.

Then, the chopping operation of the current mirror circuit 100 will be described in more detail using FIG. 7, FIG. 8, FIG. 9, and FIG. 10. FIG. 7 through FIG. 10 show a detailed configuration example of the current mirror circuit 100. In FIG. 7 through FIG. 10, coupling configurations of the transistors T5, T6, T7, T8, T9, and T10 are shown in addition to the transistors T1, T2, T3, and T4 shown in FIG. 2 through FIG. 5. The transistors T5, T6, T7, T8, T9, and T10 are a fifth transistor, a sixth transistor, a seventh transistor, an eighth transistor, a ninth transistor, and a tenth transistor, respectively. The transistors T5, T6, T7, and T8 are, for example, MOS transistors, and are, for example, P-type MOS transistors. The transistors T9, T10 are, for example, bipolar transistors. It should be noted that it is possible to adopt a variety of modified implementations such as using bipolar transistors as the transistors T5 through T8, or using N-type MOS transistors as the transistors T9, T10.

Figure 7:
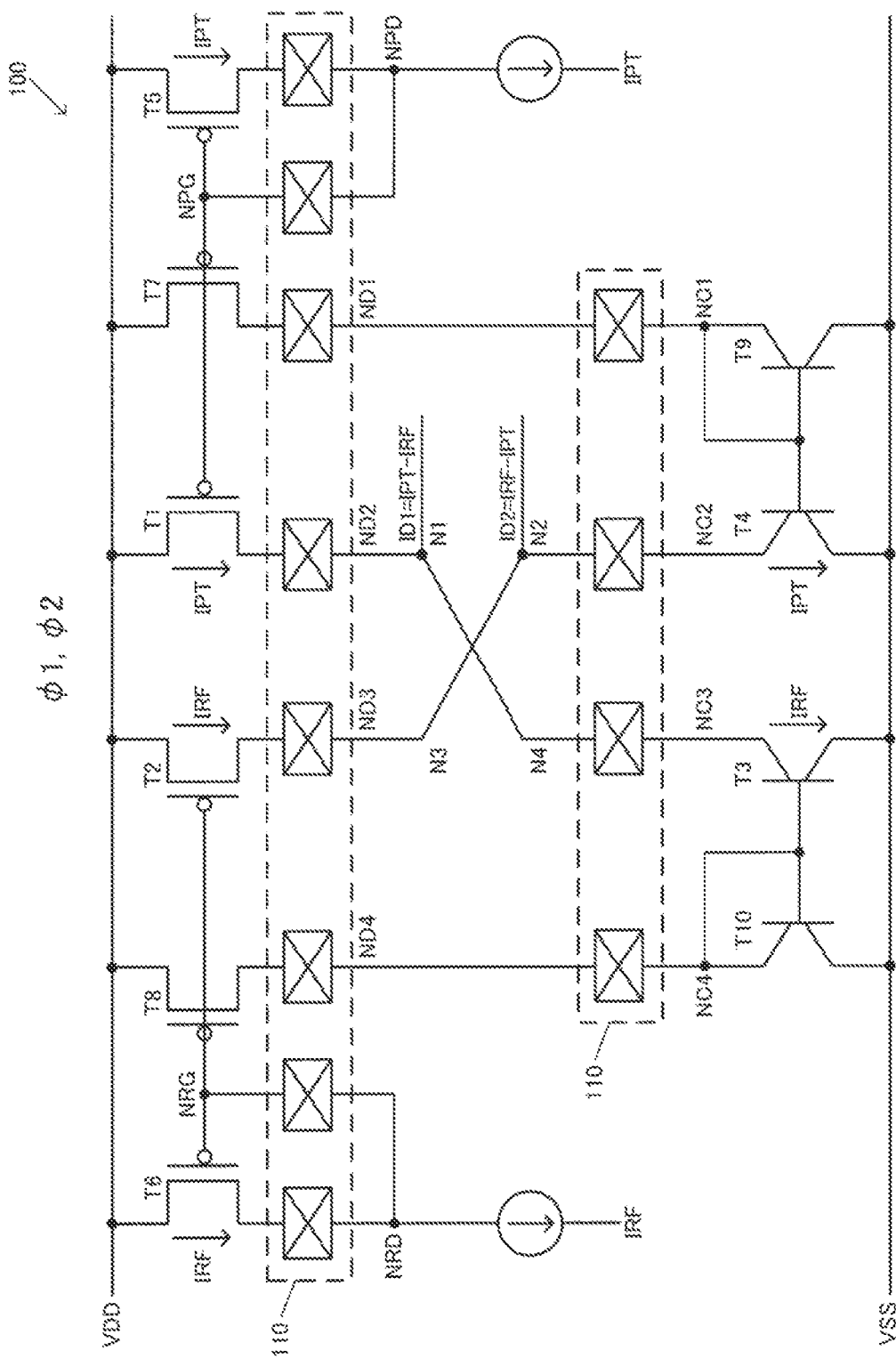
FIG. 7 is a detailed explanatory diagram of the chopping operation of the current mirror circuit.

In FIG. 7, the temperature detection current IPT is input to the drain of the transistor T5. Further, by the drain and the gate of the transistor T5 being coupled to each other, and at the same time, the gate of the transistor T5 being coupled to the gates of the transistors T7, T1, the current mirror of the temperature detection current IPT flowing through the transistor T5 is performed, and thus, the mirror current of the temperature detection current IPT becomes to flow through the transistors T7, T1. Further, by a node ND1 of the drain of the transistor T7, a node NC1 of the collector and a node of the base of the transistor T9, and a node of the base of the transistor T4 being coupled to each other, the mirror current of the temperature detection current IPT becomes to flow through the transistors T9, T4.

Further, in FIG. 7, the reference current IRF is input to the drain of the transistor T6. Further, by the drain and the gate of the transistor T6 being coupled to each other, and at the same time, the gate of the transistor T6 being coupled to the gates of the transistors T8, T2, the current mirror of the reference current IRF flowing through the transistor T6 is performed, and thus, the mirror current of the reference current IRF becomes to flow through the transistors T8, T2. Further, by a node ND4 of the drain of the transistor T8, a node NC4 of the collector and a node of the base of the transistor T10, and a node of the base of the transistor T3 being coupled to each other, the mirror current of the reference current IRF becomes to flow through the transistors T10, T3.

It should be noted that in the present embodiment, it is assumed that the mirror current of the temperature detection current IPT is arbitrarily be described simply as the temperature detection current IPT, and the mirror current of the reference current IRF is arbitrarily be described simply as the reference current IRF. Further, the chopping circuit 110 shown in FIG. 7 through FIG. 10 is constituted by a plurality of switches each coupling the corresponding two transistors to each other similarly to FIG. 2 through FIG. 5.

FIG. 7 shows a state when both of the chopping control signals φ1, φ2 are active, and the source side first state SC1 and the sink side first state SK1 shown in FIG. 2 and FIG. 6 are achieved. In FIG. 7, the temperature detection current IPT flows through the transistors T1, T4, and the reference current IRF flows through the transistors T2, T3. Further, the temperature detection current IPT from the transistor T1 flows to the output node N1 as the source current, and the reference current IRF from the transistor T3 is pulled in from the output node N1 as the sink current. Thus, the difference current ID1=IPT−IRF becomes to be output from the output node N1. Further, the reference current IRF from the transistor T2 flows to the output node N2 as the source current, and the temperature detection current IPT from the transistor T4 is pulled in from the output node N2 as the sink current. Thus, the difference current ID2=IRF−IPT becomes to be output from the output node N2.

Figure 8:
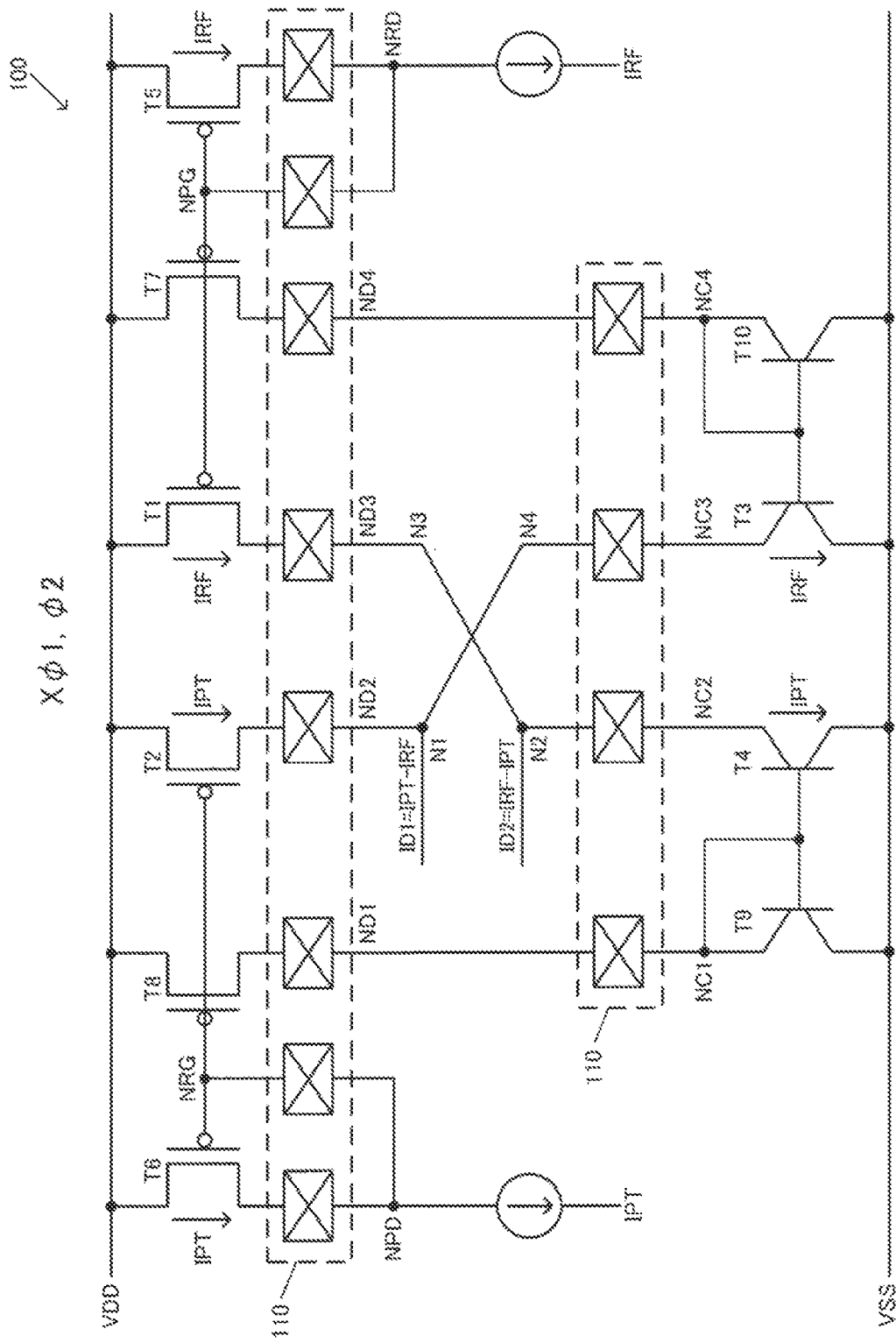
FIG. 8 is a detailed explanatory diagram of the chopping operation of the current mirror circuit.

FIG. 8 shows a state when the chopping control signal φ1 is inactive, and the chopping control signal φ2 is active, and the source side second state SC2 and the sink side first state SK1 shown in FIG. 3 and FIG. 6 are achieved. In FIG. 8, the temperature detection current IPT flows through the transistors T2, T4, and the reference current IRF flows through the transistors T1, T3. Further, the temperature detection current IPT from the transistor T2 flows to the output node N1 as the source current, and the reference current IRF from the transistor T3 is pulled in from the output node N1 as the sink current. Thus, the difference current ID1=IPT−IRF becomes to be output from the output node N1. Further, the reference current IRF from the transistor T1 flows to the output node N2 as the source current, and the temperature detection current IPT from the transistor T4 is pulled in from the output node N2 as the sink current. Thus, the difference current ID2=IRF−IPT becomes to be output from the output node N2.

Figure 9:
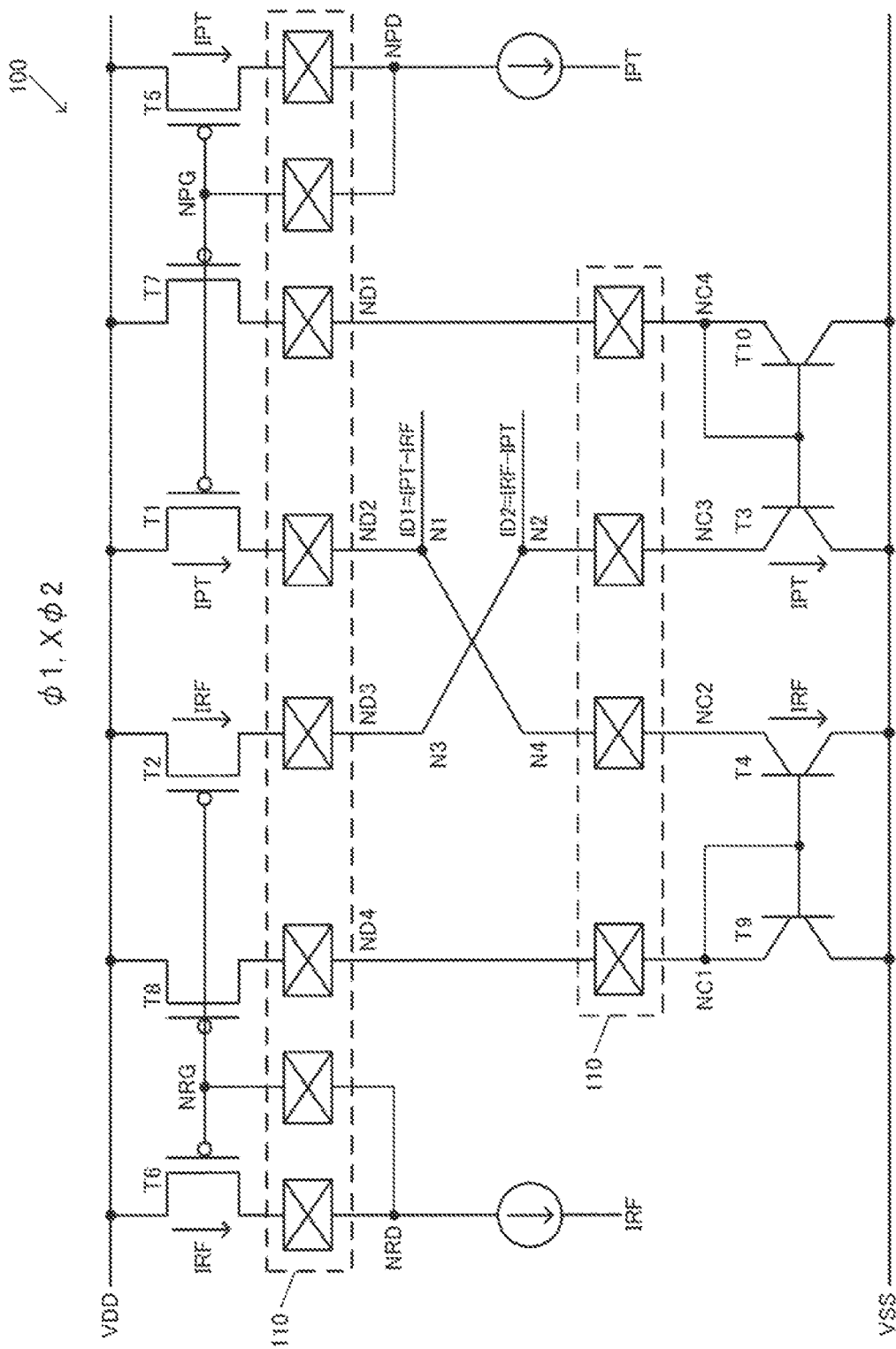
FIG. 9 is a detailed explanatory diagram of the chopping operation of the current mirror circuit.

FIG. 9 shows a state when the chopping control signal φ1 is active, and the chopping control signal φ2 is inactive, and the source side first state SC1 and the sink side second state SK2 shown in FIG. 4 and FIG. 6 are achieved. In FIG. 9, the temperature detection current IPT flows through the transistors T1, T3, and the reference current IRF flows through the transistors T2, T4. Further, the temperature detection current IPT from the transistor T1 flows to the output node N1 as the source current, and the reference current IRF from the transistor T4 is pulled in from the output node N1 as the sink current. Thus, the difference current ID1=IPT−IRF becomes to be output from the output node N1. Further, the reference current IRF from the transistor T2 flows to the output node N2 as the source current, and the temperature detection current IPT from the transistor T3 is pulled in from the output node N2 as the sink current. Thus, the difference current ID2=IRF-IPT becomes to be output from the output node N2.

Figure 10:
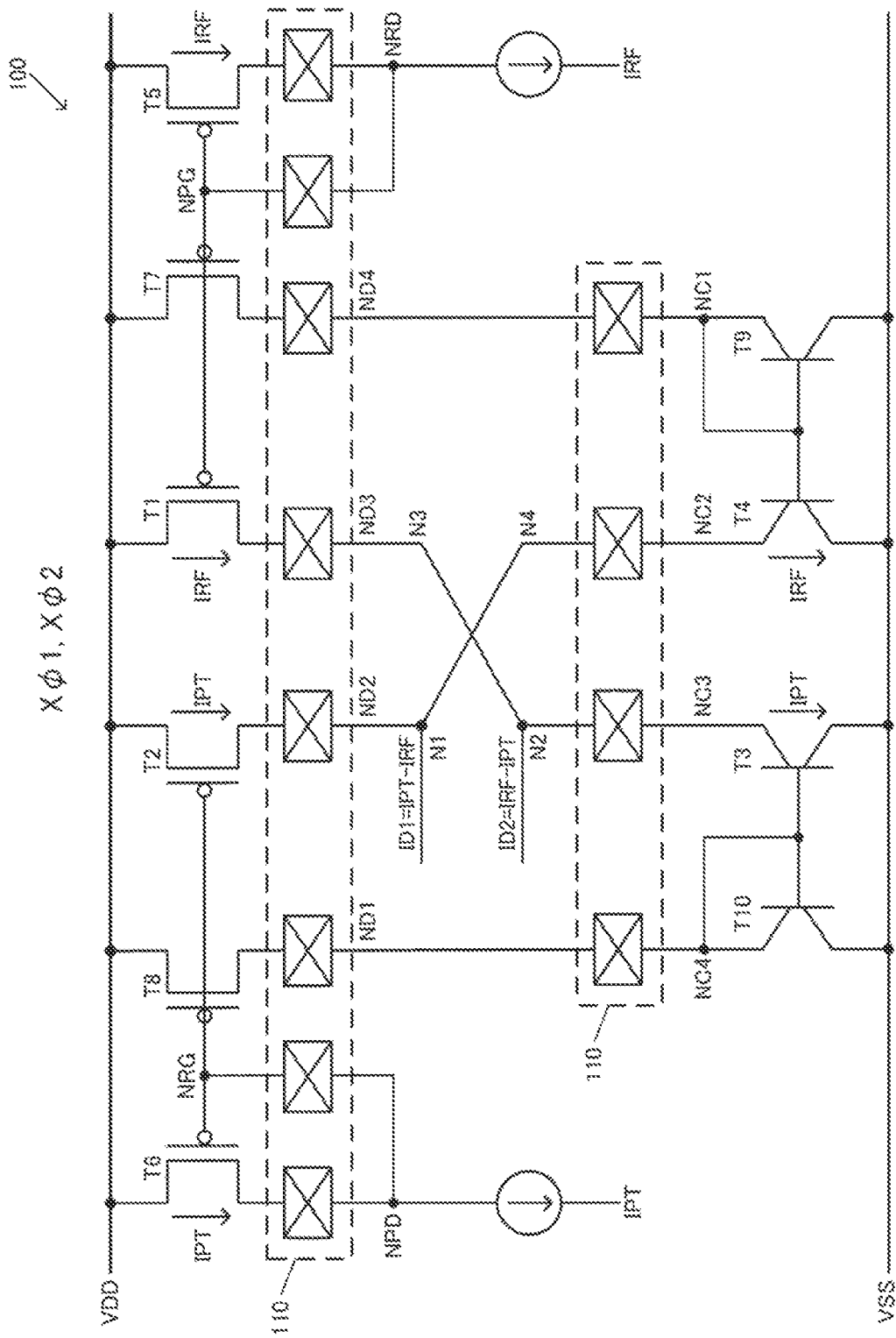
FIG. 10 is a detailed explanatory diagram of the chopping operation of the current mirror circuit.

FIG. 10 shows a state when both of the chopping control signals φ1, φ2 are inactive, and the source side second state SC2 and the sink side second state SK2 shown in FIG. 5 and FIG. 6 are achieved. In FIG. 10, the temperature detection current IPT flows through the transistors T2, T3, and the reference current IRF flows through the transistors T1, T4. Further, the temperature detection current IPT from the transistor T2 flows to the output node N1 as the source current, and the reference current IRF from the transistor T4 is pulled in from the output node N1 as the sink current. Thus, the difference current ID1=IPT−IRF becomes to be output from the output node N1. Further, the reference current IRF from the transistor T1 flows to the output node N2 as the source current, and the temperature detection current IPT from the transistor T3 is pulled in from the output node N2 as the sink current. Thus, the difference current ID2=IRF-IPT becomes to be output from the output node N2.

As described above, in FIG. 7 through FIG. 10, the current mirror circuit 100 includes the P-type transistor T5 the gate of which is coupled to the gate of the transistor T1, and the P-type transistor T6 the gate of which is coupled to the gate of the transistor T2. The transistor 15 is the fifth transistor, and the transistor T6 is the sixth transistor. Further, the P-type transistor is also used as the transistor T1 as the first transistor and the transistor T2 as the second transistor. Further, in the source side first state SC1 shown in FIG. 7 and FIG. 9, the chopping circuit 110 couples the gate and the drain of the transistor T5 to a supply node NPD of the temperature detection current IPT, and couples the gate and the drain of the transistor T6 to a supply node NRD of the reference current IRF. Further, in the source side second state SC2 shown in FIG. 8 and FIG. 10, the chopping circuit 110 couples the gate and the drain of the transistor T5 to the supply node NRD of the reference current IRF, and couples the gate and the drain of the transistor T6 to the supply node NPD of the temperature detection current IPT. In this way, it becomes possible to make the mirror current of the temperature detection current IPT flow through the transistor T1 and at the same time make the mirror current of the reference current IRF flow through the transistor T2 in the source side first state SC1, and to make the mirror current of the reference current IRF flow through the transistor T1 and at the same time make the mirror current of the temperature detection current IPT flow through the transistor T2 in the source side second state SC2.

In other words, in the source side first state SC1 in which the chopping control signal φ1 becomes active as shown in FIG. 7 and FIG. 9, the chopping circuit 110 couples the gate and the drain of the transistor 15 and the gate of the transistor T1 to the supply node NPD of the temperature detection current IPT, and couples the gate and the drain of the transistor T6 and the gate of the transistor T2 to the supply node NRD of the reference current IRF. Thus, the mirror current of the temperature detection current IPT becomes to flow through the transistor T1, and the mirror current of the reference current IRF becomes to flow through the transistor T2. On the other hand, in the source side second state SC2 in which the chopping control signal φ1 becomes inactive as shown in FIG. 8 and FIG. 10, the chopping circuit 110 couples the gate and the drain of the transistor T5 and the gate of the transistor T1 to the supply node NRD of the reference current IRF, and couples the gate and the drain of the transistor T6 and the gate of the transistor T2 to the supply node NPD of the temperature detection current IPT. Thus, the mirror current of the reference current IRF becomes to flow through the transistor T1, and the mirror current of the temperature detection current IPT becomes to flow through the transistor T2. Thus, it becomes possible to realize the source side chopping operation in which in the source side second state SC2, the reference current IRF is made to flow through the transistor T1 through which the temperature detection current IPT flows in the source side first state SC1, and in the source side second state SC2, the temperature detection current IPT is made to flow through the transistor T2 through which the reference current IRF flows in the source side first state SC1. By performing the modulation of chopping of switching the current flowing through each of the transistors T1, T2 between the temperature detection current IPT and the reference current IRF as described above, the noise such as the 1/f noise of the transistors T1, T2 is prevented from being transmitted to the A/D conversion circuit in the posterior stage, and thus, it becomes possible to realize the increase in accuracy of the digital-output temperature sensor 80.

Figure 11:
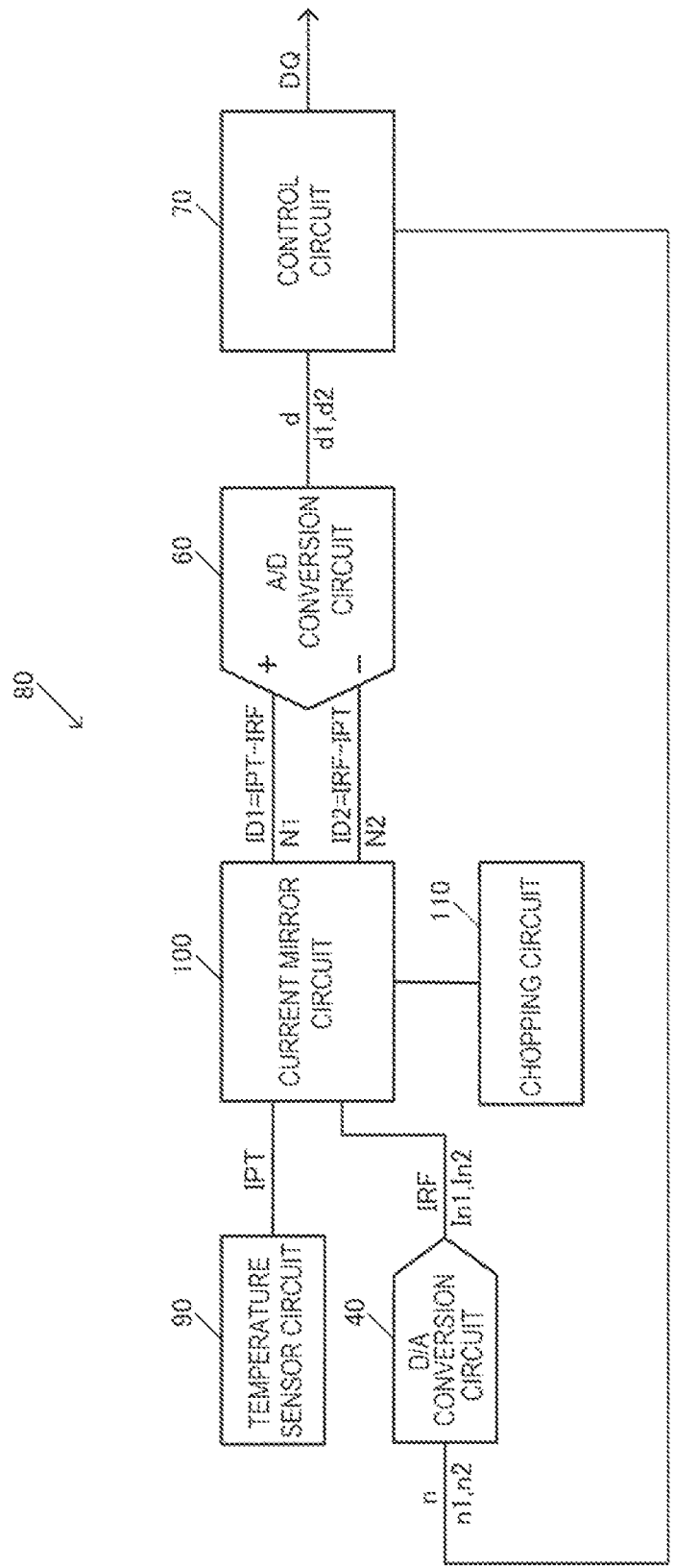
FIG. 11 is a diagram showing a detailed configuration example of the digital-output temperature sensor according to the embodiment.

FIG. 11 shows a detailed configuration example of the digital-output temperature sensor 80 according to the present embodiment. In FIG. 11, there are further disposed a D/A conversion circuit 40 and a control circuit 70 in addition to the constituents such as the temperature sensor circuit 90, the current mirror circuit 100, the chopping circuit 110, and the A/D conversion circuit 60 shown in FIG. 1.

The D/A conversion circuit 40 performs a D/A conversion on DAC input digital values n to output the reference current IRF corresponding to the DAC input digital values n. In other words, the D/A conversion circuit 40 outputs the reference current IRF the current value of which is set in accordance with the DAC input digital values n. The control circuit 70 outputs the DAC input digital values n to the D/A conversion circuit 40.

Further, the A/D conversion circuit 60 performs the A/D conversion of the difference currents ID1, ID2 as a differential pair to output the ADC output digital values d. Specifically, in the A/D conversion circuit 60, the first difference current ID1=IPT−IRF and the second difference current ID2=IRF−IPT are input, and the ADC output digital values d are output to the control circuit 70. The control circuit 70 outputs a DAC input digital value n1 and a DAC input digital value n2 different from the DAC input digital value n1 as the DAC input digital values n. Then, the control circuit 70 obtains temperature detection data corresponding to the temperature detection current IPT based on an ADC output digital value d1 as the ADC output digital value d obtained in accordance with the DAC input digital value n1, an ADC output digital value d2 as the ADC output digital value d obtained in accordance with the DAC input digital value n2, and the DAC input digital values n, and then outputs the result as ADC result data DQ. In this way, it becomes possible to perform the A/D conversion of the temperature detection current IPT with higher resolution than the resolution of the A/D conversion circuit 60, and it becomes possible to realize the high-accuracy digital-output temperature sensor 80. It should be noted that a specific example of the configuration and the operation shown in FIG. 11 will be described in detail in FIG. 13 through FIG. 19 described later.

Figure 12:
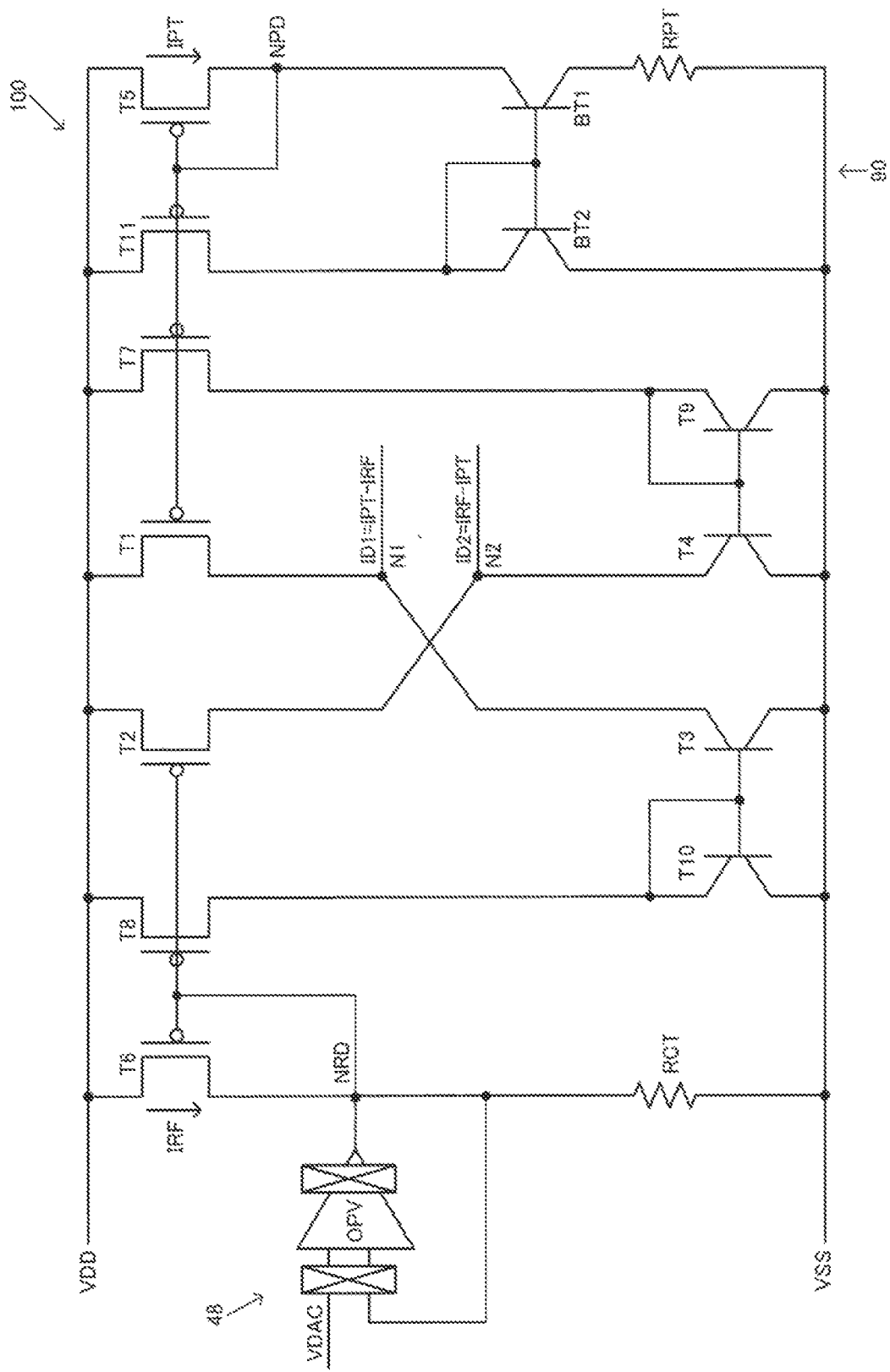
FIG. 12 is a diagram showing a detailed configuration example of the digital-output temperature sensor according to the embodiment.

FIG. 12 is also a diagram showing a detailed configuration example of the digital-output temperature sensor 80. As shown in FIG. 12, the temperature sensor circuit 90 includes bipolar transistors BT1, BT2 and a resistor RPT. The bipolar transistor BT1 and the resistor RPT are disposed in series between the supply node NPD of the temperature detection current IPT and a node of VSS as a power supply node at a low potential side. For example, the bipolar transistor BT1 is coupled to the supply node NPD of the temperature detection current IPT in the collector, and is coupled to one end of the resistor RPT in the emitter. Further, the other end of the resistor RPT is coupled to the node of VSS. Further, the bipolar transistor BT2 is disposed between the drain of a transistor T11 and the node of VSS. The gate of the transistor T11 is coupled to a node NPG of the gate of the transistor T5. Specifically, the bipolar transistor BT2 is coupled to the drain of the transistor T11 in the collector, and is coupled to the base of the bipolar transistor BT1 in the base, and is coupled to the node of VSS in the emitter. Thus, the temperature detection current IPT becomes to flow through the bipolar transistors BT1, BT2. Further, the bipolar transistors BT1, BT2 are each constituted by a plurality of unit transistors, and are different in number of the unit transistors from each other. Thus, it becomes possible for the temperature sensor circuit 90 to generate the temperature detection current IPT having, for example, a positive temperature characteristic corresponding to a ratio of the number of the unit transistors and a resistance value of the resistor RPT.

Further, the D/A conversion circuit 40 includes, for example, a voltage-output type D/A conversion circuit and a voltage/current conversion circuit 48 for converting an output voltage VDAC of the voltage-output type D/A conversion circuit into the reference current IRF. Further, as shown in FIG. 12, the voltage/current conversion circuit 48 includes an operational amplifier OPV and a resistor RCT. When defining the resistance value of the resistor RCT as, for example, R, the voltage/current conversion circuit 48 outputs the reference current IRF expressed as IRF=VDAC/R. It should be noted that as the voltage-output type D/A conversion circuit, there can be cited, for example, a resistor-ladder type D/A conversion circuit. Further, in FIG. 12, the modulation and the demodulation of chopping are performed also in the operational amplifier OPV in the voltage/current conversion circuit 48. In this way, it is possible to prevent the noise such as the 1/f noise generated in the operational amplifier OPV from being superimposed on the reference current IRF, and thus, it becomes possible to realize the increase in accuracy of the digital-output temperature sensor 80.

2. Increase in Accuracy of A/D Conversion

Figure 13:
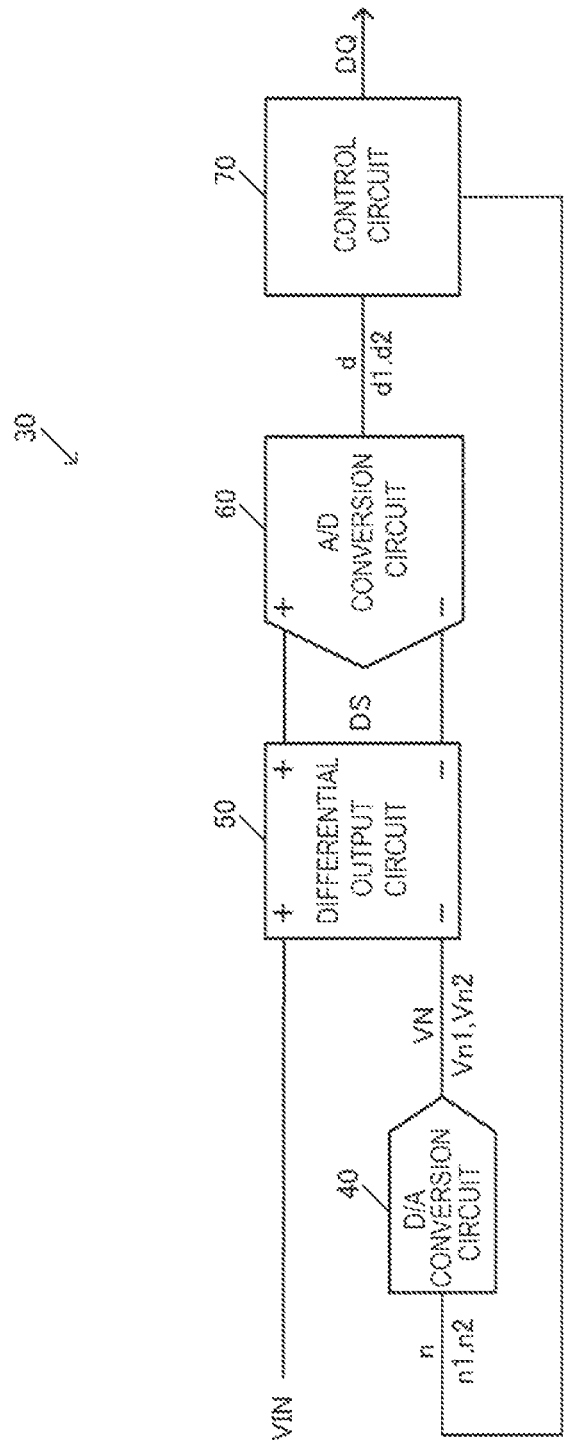
FIG. 13 is a diagram showing a configuration example of an A/D converter which realizes a high-accuracy A/D conversion.

Then, a method in the present embodiment for realizing the increase in accuracy of the A/D conversion will be described using FIG. 13 through FIG. 19. It should be noted that a circuit including the D/A conversion circuit 40, a difference output circuit 50, the A/D conversion circuit 60, and the control circuit 70 shown in FIG. 13 is hereinafter described as an A/D converter 30 for the sake of convenience of explanation. In the method in the present embodiment, there can be realized the A/D converter 30 which is higher in resolution than the A/D conversion circuit 60, and is therefore high in accuracy. Further, the description will hereinafter be presented assuming that a DAC output signal VN of the D/A conversion circuit 40 is a voltage signal for the sake of convenience of explanation, but in reality, the DAC output signal VN of the D/A conversion circuit 40 is the reference current IRF as a current signal as shown in FIG. 11. Further, an input signal VIN shown in FIG. 13 corresponds to the temperature detection current IPT, and the difference output circuit 50 corresponds to the current mirror circuit 100.

In FIG. 13, the D/A conversion circuit 40 performs the D/A conversion on the DAC input digital value n to output the DAC output signal VN. As the D/A conversion circuit 40, it is desirable to use, for example, a resistor-ladder type D/A conversion circuit. It should be noted that in the present embodiment, it is possible to use a D/A conversion circuit of another type such as a capacitance array type, a delta-sigma type, or a current output type as the D/A conversion circuit 40.

The difference output circuit 50 outputs difference signals DS based on a difference between the input signal VIN and the DAC output signal VN. As described above, the input signal VIN corresponds to the temperature detection current IPT, the DAC output signal VN corresponds to the reference current IRF, and the difference output circuit 50 corresponds to the current mirror circuit 100. In the difference output circuit 50, for example, the input signal VIN is input to a first input terminal of the differential input, the DAC output signal VN is input to a second input terminal of the differential input, and the difference signals DS of the input signal VIN and the DAC output signal VN are output to, for example, differential output terminals. The first input terminal is, for example, a non-inverting input terminal, and the second input terminal is, for example, an inverting input terminal. The difference signals DS are formed of, for example, a first difference signal corresponding to VIN−VN, and a second difference signal corresponding to VN−VIN. The first difference signal corresponds to the difference current ID1=IPT−IRF described above, and the second difference signal corresponds to the difference current ID2=IRF−IPT described above.

The A/D conversion circuit 60 performs the A/D conversion on the difference signals DS to output the ADC output digital values d. For example, in the A/D conversion circuit 60, the first difference signal of the difference signals DS is input to the first input terminal of the differential input, the second difference signal of the difference signals DS is input to the second input terminal of the differential input, and the ADC output digital values d obtained by performing the A/D conversion on the difference between the first difference signal and the second difference signal are output. As the A/D conversion circuit 60, it is desirable to use, for example, a successive-approximation type A/D conversion circuit. It should be noted that in the present embodiment, it is possible to use an A/D conversion circuit of another type such as a delta-sigma type, or a pipeline type except the successive-approximation type as the A/D conversion circuit 60.

The control circuit 70 outputs the DAC input digital values n. For example, the control circuit 70 outputs the DAC input digital values n based on the ADC output digital values d from the A/D conversion circuit 60. For example, the control circuit 70 executes arithmetic processing based on the ADC output digital values d to output the DAC input digital values n to the D/A conversion circuit 40. Further, the control circuit 70 outputs the ADC result data DQ as a conclusive result. In other words, a digital value of the ADC result data DQ is output. The ADC result data DQ corresponds to the temperature detection data of the digital-output temperature sensor 80. The control circuit 70 can be realized by a logic circuit.

Specifically, the control circuit 70 outputs the DAC input digital value n1 and the DAC input digital value n2 different from the DAC input digital value n1 as the DAC input digital values n. The DAC input digital value n1 is a first DAC input digital value, and the DAC input digital value n2 is a second DAC input digital value. Then, the control circuit 70 obtains the ADC result data DQ based on the ADC output digital value d1 as the ADC output digital value d obtained in accordance with the DAC input digital value n1, the ADC output digital value d2 as the ADC output digital value d obtained in accordance with the DAC input digital value n2, and the DAC input digital values n. For example, when one of the DAC input digital values n1, n2 can be obtained from the other thereof, the control circuit 70 obtains the ADC result data DQ from the ADC output digital value d1, the ADC output digital value d2, and one of the DAC input digital values n1, n2. The ADC output digital value d1 is a first ADC output digital value, and the ADC output digital value d2 is a second ADC output digital value.

For example, when the control circuit 70 outputs the DAC input digital value n1, the D/A conversion circuit 40 performs the D/A conversion of the DAC input digital value n1 to output the DAC output signal VN=Vn1. Then, the difference output circuit 50 outputs the difference signals DS based on the difference between the input signal VIN and the DAC output signal Vn1, and the A/D conversion circuit 60 performs the A/D conversion of the difference signals DS to thereby output the ADC output digital value d=d1 to the control circuit 70. Further, when the control circuit 70 outputs the DAC input digital value n2, the D/A conversion circuit 40 performs the D/A conversion of the DAC input digital value n2 to output the DAC output signal VN=Vn2. Then, the difference output circuit 50 outputs the difference signals DS based on the difference between the input signal VIN and the DAC output signal Vn2, and the A/D conversion circuit 60 performs the A/D conversion of the difference signals DS to thereby output the ADC output digital value d=d2 to the control circuit 70. Then, the control circuit 70 obtains the ADC result data DQ based on the ADC output digital values d1, d2, and the DAC input digital values n. For example, the control circuit 70 obtains the ADC result data DQ based on the ADC output digital values d1, d2, and the DAC input digital value n1 or the DAC input digital value n2, and then outputs the ADC result data DQ as a digital value of the conclusive ADC result.

As described above, the A/D converter 30 in the present embodiment performs the A/D conversion twice such as the A/D conversion based on the DAC input digital value n1 and the A/D conversion based on the DAC input digital value n2. Then, the ADC result data DQ as the conclusive result is calculated based on the ADC output digital value d1 as the A/D conversion result based on the DAC input digital value n1, and the ADC output digital value d2 as the A/D conversion result based on the DAC input digital value n2. Further, the ADC output digital value d1 can be obtained by the A/D conversion circuit 60 performing the A/D conversion on a difference between the input signal VIN and the DAC output signal Vn1 which is obtained by the D/A conversion circuit 40 performing the D/A conversion on the DAC input digital value n1. Further, the ADC output digital value d2 can be obtained by the A/D conversion circuit 60 performing the A/D conversion on a difference between the input signal VIN and the DAC output signal Vn2 which is obtained by the D/A conversion circuit 40 performing the D/A conversion on the DAC input digital value n2. In this way, it becomes possible to realize the A/D converter 30 capable of performing the A/D conversion having higher accuracy than the resolution of the A/D conversion circuit 60 using the A/D conversion circuit 60 and the D/A conversion circuit 40. As an example, when the resolution of the A/D conversion circuit 60 is, for example, 15 through 16 bits, it becomes possible to increase the resolution by, for example, two bits to realize the A/D converter 30 with the resolution of, for example, 17 through 18 bits. Further, according to the present embodiment, it becomes possible to realize the A/D converter 30 having higher accuracy than the resolution of the A/D conversion circuit 60 using, for example, the single A/D conversion circuit 60 without using two A/D conversion circuits such as a Coarse ADC and a Fine ADC. For example, by performing the conversion twice with the settings of the A/D conversion circuit 60 and the D/A conversion circuit changed, it becomes possible to moderate the precision requirement for an analog gain which becomes a challenge in a Two-step ADC using the Coarse ADC and the Fine ADC, and thus, it becomes possible to realize, for example, a linearity improvement and prevention of missing code.

Figure 14:
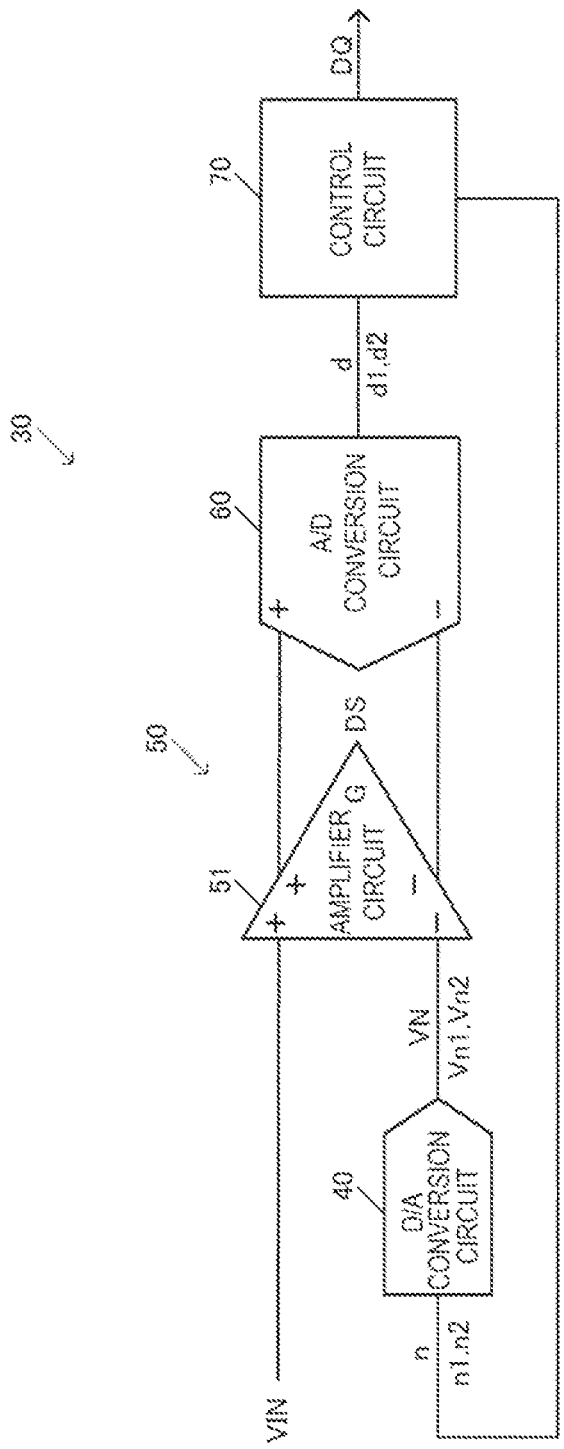
FIG. 14 is a diagram showing a configuration example of the A/D converter provided with an amplifier circuit as a difference output circuit.

FIG. 14 shows a configuration example of the A/D converter 30 in the present embodiment when providing an amplifier circuit 51 as the difference output circuit 50. In FIG. 14, the input signal VIN becomes an input voltage. Further, the D/A conversion circuit 40 outputs a DAC output voltage obtained by performing the D/A conversion on the DAC input digital value n as the DAC output signal VN. Specifically, the D/A conversion circuit 40 outputs the DAC output voltage obtained by performing the D/A conversion on the DAC input digital value n=n1 as the DAC output signal VN=Vn1, and outputs the DAC output voltage obtained by performing the D/A conversion on the DAC input digital value n=n2 as the DAC output signal VN=Vn2. Further, as the difference output circuit 50, there is disposed the amplifier circuit 51 for differentially amplifying the input signal VIN as the input voltage and the DAC output signal VN as the DAC output voltage. In FIG. 14, the amplifier circuit 51 differentially amplifies the input signal VIN and the DAC output signal VN with a gain G to output the difference signals DS as the differential voltage signals to the A/D conversion circuit 60. When providing such an amplifier circuit 51, it becomes possible to input the difference signals DS obtained by amplifying the difference between the input signal VIN and the DAC output signal VN to the A/D conversion circuit 60. Therefore, it becomes possible for the A/D conversion circuit 60 to perform the A/D conversion in, for example, full scale on the difference signals DS in a wide amplitude range amplified by the amplifier circuit 51, and thus it becomes possible to realize the high-accuracy A/D conversion. For example, by the A/D conversion circuit 60 performing the A/D conversion on the signal amplified by the amplifier circuit 51, it becomes possible to realize the A/D converter 30 higher in resolution than the A/D conversion circuit 60. It should be noted that the gain G as a gain of a signal of the amplifier circuit 51 can be set to, for example, 10 through 20 times.

Figure 15:
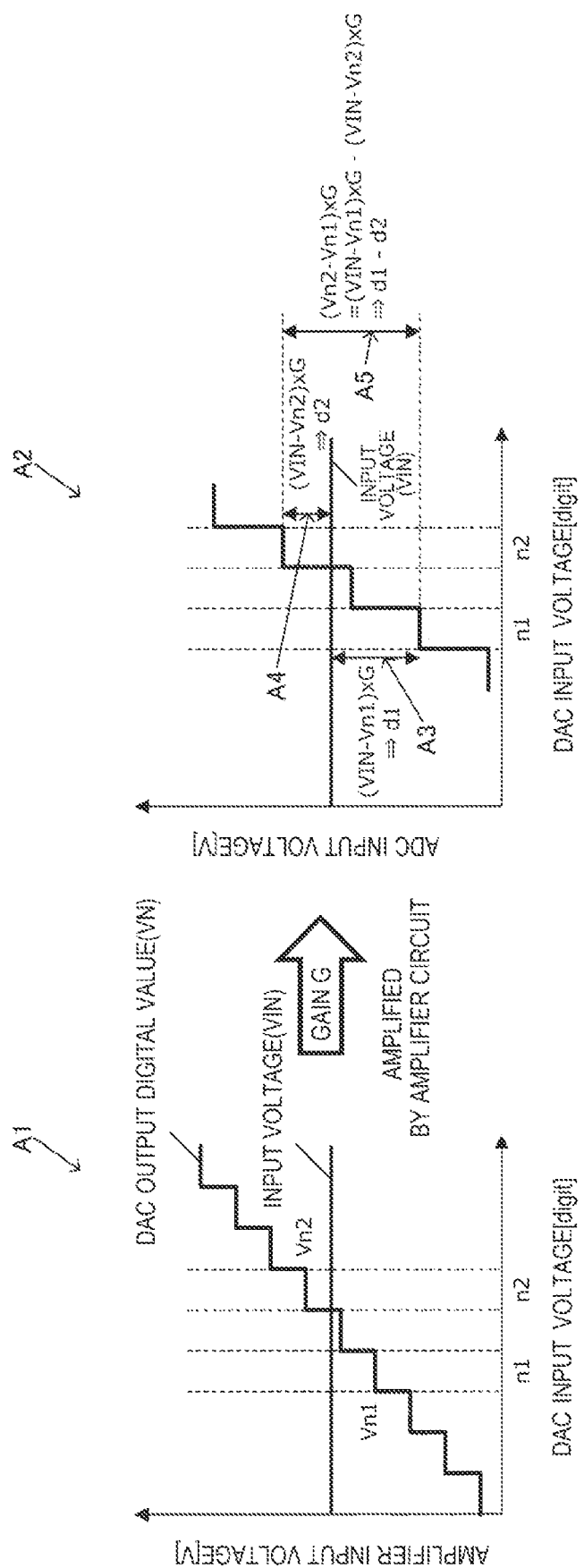
FIG. 15 is an operation explanatory diagram of the A/D converter.

FIG. 15 is an operation explanatory diagram of the A/D converter 30 in the present embodiment. A graph A1 in FIG. 15 shows a relationship between the input voltage and the DAC output voltage. The input voltage is a voltage of the input signal VIN, and the DAC output voltage is a voltage of the DAC output signal VN. The DAC input digital values n on the horizontal axis of the graph A1 in FIG. 15 are digital values to be input to the D/A conversion circuit 40, and the digital value is also called a digital code. As shown in the graph A1 in FIG. 15, in the D/A conversion circuit 40, when the DAC input digital value n1 is input, the DAC output voltage Vn1 is output to the amplifier circuit 51, and when the DAC input digital value n2 is input, the DAC output voltage Vn2 is output to the amplifier circuit 51. In the graph A1 in FIG. 15, the input voltage VIN of the A/D converter 30 takes a voltage value, for example, between the DAC output voltages Vn1, Vn2. It should be noted that in the present embodiment, the input signal VIN is arbitrarily described as the input voltage, the D/A conversion circuit 40 is arbitrarily described as DAC, and the A/D conversion circuit 60 is arbitrarily described as ADC.

A graph A2 in FIG. 15 shows a relationship between the input voltage and the ADC input voltages after the amplification by the amplifier circuit 51. The ADC input voltages are difference voltages as the voltages of the difference signals DS. In the graph A2 shown in FIG. 15, signal amplification with the gain G (G>1) is performed by the amplifier circuit 51.

As shown in the graph A1 in FIG. 15, when the DAC input digital value n1 is input to the D/A conversion circuit 40, the D/A conversion circuit 40 outputs the output voltage of Vn1. Then, as shown in the graph A2 in FIG. 15, the amplifier circuit 51 amplifies the difference voltage VIN-Vn1 between the input voltage VIN and the DAC output voltage Vn1 with the gain G to output the result to the A/D conversion circuit 60, and the A/D conversion circuit 60 performs the A/D conversion on the voltage of (VIN-Vn1)×G to output the ADC output digital value d1 to the control circuit 70. Further, as shown in the graph A1 in FIG. 15, when the DAC input digital value n2 is input to the D/A conversion circuit 40, the D/A conversion circuit 40 outputs the output voltage of Vn2. Then, as shown in the graph A2 in FIG. 15, the amplifier circuit 51 amplifies the difference voltage VIN-Vn2 between the input voltage VIN and the DAC output voltage Vn2 with the gain G to output the result to the A/D conversion circuit 60, and the A/D conversion circuit 60 performs the A/D conversion on the voltage of (VIN-Vn2)×G to output the ADC output digital value d2 to the control circuit 70.

Further, the control circuit 70 obtains the ADC result data DQ based on the ADC output digital value d1 input from the A/D conversion circuit 60 when outputting the DAC input digital value n1 to the D/A conversion circuit 40, and the ADC output digital value d2 input from the A/D conversion circuit 60 when outputting the DAC input digital value n2 to the D/A conversion circuit 40. For example, the difference voltage indicated by an arrow A3 in FIG. 15 is expressed as (VIN-Vn1)×G, which corresponds to the ADC output digital value d1. The difference voltage indicated by an arrow A4 is expressed as (VIN-Vn2)×G, which corresponds to the ADC output digital value d2. Further, the difference voltage indicated by an arrow A5 is expressed as follows, which corresponds to a difference d1-d2 between the ADC output digital values d1, d2.

$$(Vn2-Vn1) \times G = (VIN-Vn1) \times G - (VIN-Vn2) \times G$$

Therefore, the input voltage VIN of the A/D converter 30 can be identified from the ratios of the difference voltage indicated by the arrow A3 and the difference voltage indicated by the arrow A4 to the difference voltage indicated by the arrow A5. Specifically, the input voltage VIN can be identified as the following formula (1).

$$VIN = Vn1 + (Vn2 - Vn1)\frac{G(VIN - Vn1)}{G(Vn2 - Vn1)} = Vn1 + (Vn2 - Vn1)\frac{d_1}{d_1 - d_2} \quad (1)$$

Therefore, it becomes possible for the control circuit 70 to calculate and then output the ADC result data DQ as the following formula (2).

$$DQ = n1 + (n2 - n1)\frac{d_1}{d_1 - d_2} \quad (2)$$

For example, when the input voltage VIN has a voltage value between Vn1 and Vn2, the input voltage VIN becomes a voltage expressed by a ratio d1/(d1-d2) between Vn1 and Vn2. For example, when d1/(d1-d2) is 0.5, VIN=Vn1+(Vn2-Vn1)×0.5 is achieved, and the input voltage VIN has a voltage value in the middle of Vn1 and Vn2. When d1/(d1-d2) is 0.6, VIN=Vn1+(Vn2-Vn1)×0.6 is achieved, and the input voltage VIN has a voltage value expressed by a ratio of 60% between Vn2 and Vn1. It should be noted that when the input voltage VIN is not a voltage between Vn1 and Vn2, it is possible to identify the input voltage VIN using the formula (1) described above, and it is possible for the control circuit 70 to obtain and then output the ADC result data DQ as expressed in the formula (2) described above.

According to the present embodiment, even when, for example, disposing the amplifier circuit 51 in the anterior stage of the A/D conversion circuit 60 in order to increase the resolution of the A/D conversion, it becomes difficult for the circuit characteristics of the amplifier circuit 51 as the amplification circuit to affect the result of the A/D conversion. For example, as shown in formulas (1), (2) described above, in theory, the gain G of the amplifier circuit 51 does not at all affect the result of the A/D conversion. Further, in the present embodiment, the control circuit 70 generates the DAC input digital values n based on the ADC output digital values d from the A/D conversion circuit 60. For example, the control circuit 70 generates the DAC input digital values n using feedback control. By performing such feedback control, it becomes possible to approximate the DAC output voltage VN of the D/A conversion circuit 40 to the input voltage VIN. For example, when the DAC output voltage VN and the input voltage VIN are too far from each other, it becomes difficult to obtain an accurate A/D conversion result, but by making the DAC output voltage VN close to the input value VIN, it becomes possible to increase the accuracy of the result of the A/D conversion.

As described hereinabove, in the present embodiment, when defining the first DAC input digital value as n1, the second DAC input digital value as n2, the first ADC output digital value as d1, the second ADC output digital value d2, and the ADC result data as DQ, the control circuit 70 obtains the ADC result data DQ using the following expression.

$$DQ = n1 + (n2-n1) \times d1/(d1-d2)$$

In other words, the control circuit 70 executes the following arithmetic processing based on the DAC input digital values n1, n2 and the ADC output digital values d1, d2 to thereby obtain the ADC result data DQ.

$$DQ = n1 + (n2-n1) \times d1/(d1-d2)$$

In this way, by the A/D conversion circuit 60 and the D/A conversion circuit 40 performing the conversion based on the DAC input digital value n1 and the conversion based on the DAC input digital value n2, and the control circuit 70 performing the following arithmetic processing, it becomes possible to realize the A/D converter 30 having higher accuracy than the resolution of the A/D conversion circuit 60.

$$DQ = n1 + (n2-n1) \times d1/(d1-d2)$$

Figure 16:
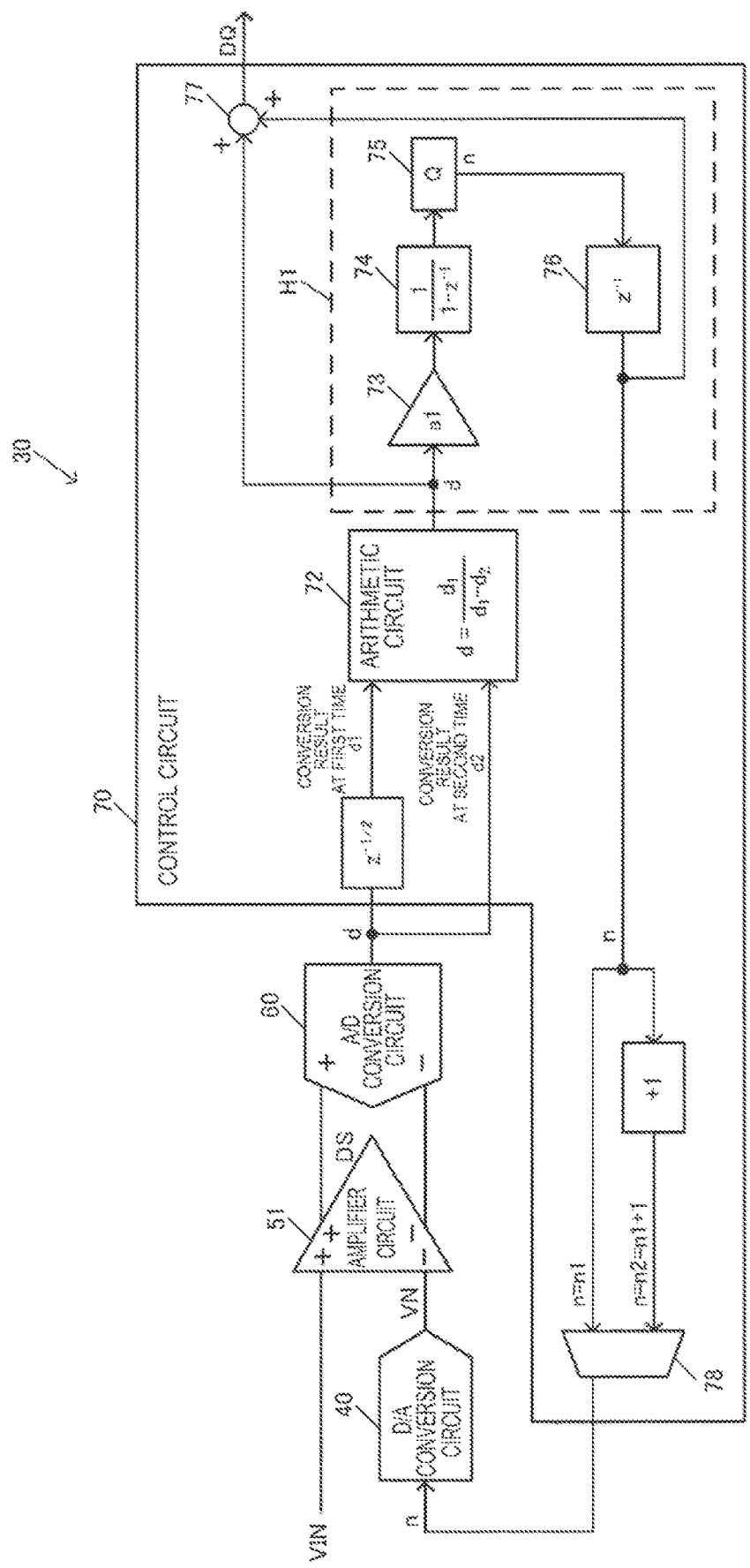
FIG. 16 is a diagram showing a detailed configuration example of the A/D converter.
Figure 17:
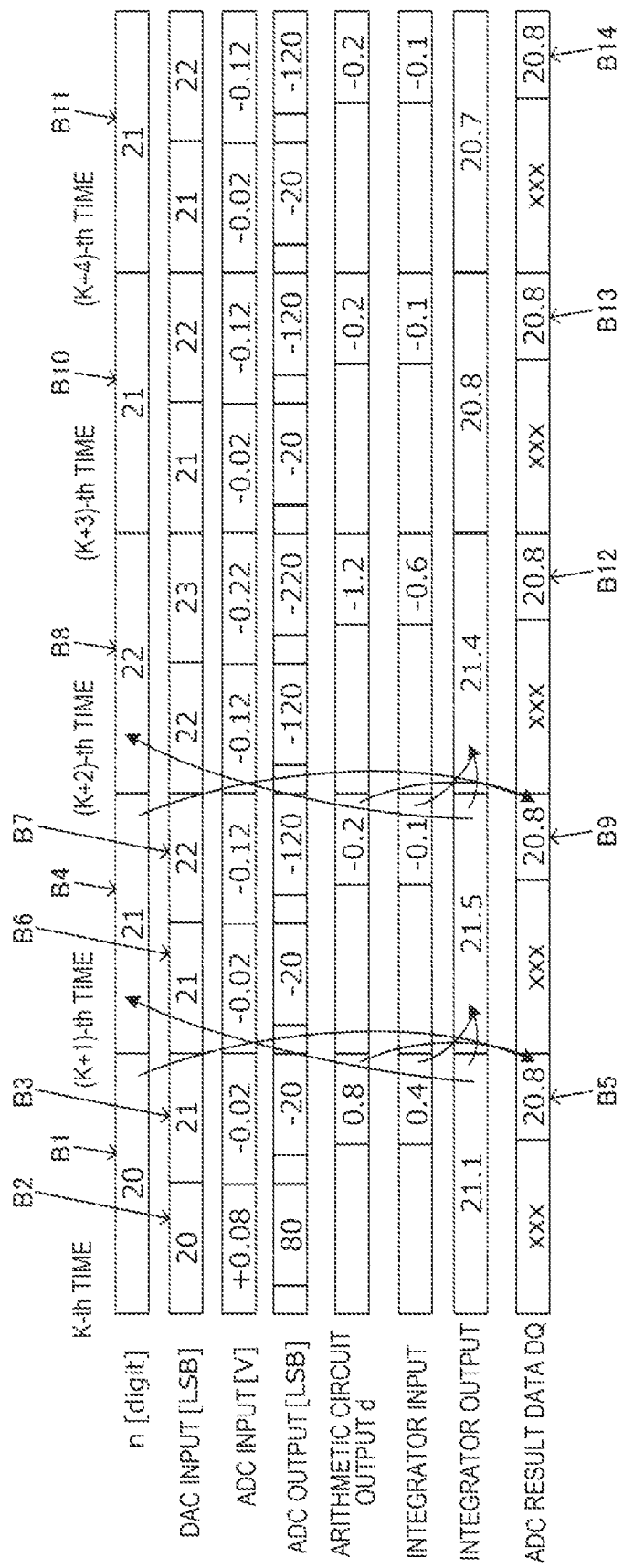
FIG. 17 is a detailed operation explanatory diagram of the A/D converter.
Figure 18:
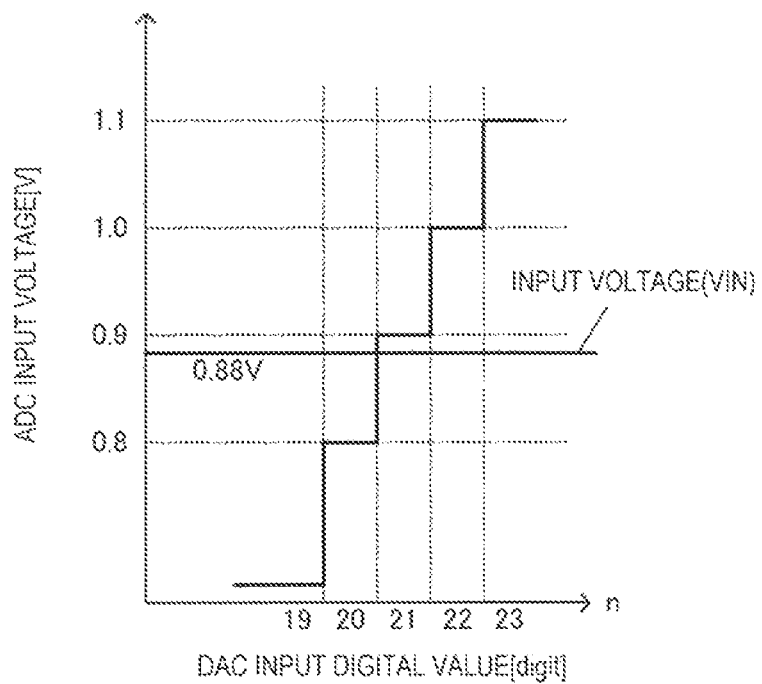
FIG. 18 is a diagram showing an example of a relationship between an input voltage and an ADC input voltage.

FIG. 16 shows a detailed configuration example of the A/D converter 30 according to the present embodiment. FIG. shows a specific configuration example of the control circuit 70. Further, FIG. 17 shows a detailed operation explanatory diagram of the A/D converter 30. It is assumed here that the input voltage VIN of, for example, 0.88 V is input as shown in FIG. 18.

In the k-th processing (k is an integer no smaller than 1) indicated by an arrow B1 in FIG. 17, a delay device 76 of the control circuit 70 shown in FIG. 16 outputs n=20. Then, as indicated by arrows B2, B3, n=20 is output to the D/A conversion circuit 40 by a selector 78 of the control circuit 70 in the first time, and n=21 is output to the D/A conversion circuit 40 in the second time. When n=20 is input to the D/A conversion circuit 40, +0.08 V, for example, is input to the A/D conversion circuit 60, and the A/D conversion circuit 60 outputs a digital value of, for example, 80. Here, 1 LSB is defined as, for example, 1 mV. Further, when n=21 is input to the D/A conversion circuit 40, −0.02 V, for example, is input to the A/D conversion circuit 60, and the A/D conversion circuit 60 outputs a digital value of, for example, −20. Then, an arithmetic circuit 72 of the control circuit 70 performs arithmetic processing of d=d1/(d1−d2) to output d=80/{80−(−20)}=0.8. A gain multiplier 73 of the control circuit 70 multiplies d=0.8 by the gain of, for example, a1=0.5, and 0.8×0.5=0.4 is input to an integrator 74 of the control circuit 70. On this occasion, the integrator 74 outputs an integration result of 21.1, and a quantizer 75 of the control circuit 70 performs quantization of converting 21.1 into an integer to output n=21 as n to be used for (k+1)-th processing as indicated by an arrow B4. Further, as indicated by an arrow B5, an adder 77 of the control circuit 70 performs add processing on n=20 used for the k-th processing and d=0.8 as the output of the arithmetic circuit 72 in the k-th processing to output DQ=20.8 as the ADC result data.

Further, as indicated by the arrow B4, in the (k+1)-th processing, the delay device 76 outputs n=21 which is obtained by the quantization in the k-th processing. Then, as indicated by arrows B6, B7, n=21 is output to the D/A conversion circuit 40 by the selector 78 in the first time, and n=22 is output to the D/A conversion circuit 40 in the second time. When n=21 is input to the D/A conversion circuit 40, −0.02 V, for example, is input to the A/D conversion circuit 60, and the A/D conversion circuit 60 outputs a digital value of, for example, −20. Further, when n=22 is input to the D/A conversion circuit 40, −0.12 V, for example, is input to the A/D conversion circuit 60, and the A/D conversion circuit 60 outputs a digital value of, for example, −120. Then, the arithmetic circuit 72 performs the arithmetic processing of d=d1/(d1−d2) to output d=−20/{20−(−120)}=−0.2. The gain multiplier 73 multiplies d=−0.2 by the gain of a1=0.5, and −0.2×0.5=−0.1 is input to the integrator 74. On this occasion, the integrator 74 outputs 21.5 which is a value obtained by adding 0.4 as the k-th integrator input to 21.1 as the k-th integration result. Then, the quantizer 75 performs quantization of converting 21.5 into an integer to output n=22 as n to be used for (k+2)-th processing as indicated by an arrow B8. Further, as indicated by an arrow B9, the adder 77 performs add processing on n=21 used for the (k+1)-th processing and d=−0.2 as the output of the arithmetic circuit 72 in the (k+1)-th processing to output DQ=20.8 as the ADC result data.

As described above, in the present embodiment, it becomes to be arranged that as indicated by the arrows B1, B4, B8, B10, and B11 in FIG. 17, the modulation such as the delta-sigma modulation on the DAC input digital values n is performed, and the DAC input digital values n thus modulated are input to the D/A conversion circuit 40. Further, as indicated by the arrow B5, B9, B12, B13, and B14, it becomes to be arranged that the ADC result data DQ corresponding to the input voltage VIN=0.88 V shown in FIG. 18 is output from the control circuit 70. For example, in FIG. 15, when a voltage difference between the DAC output voltage corresponding to the DAC input digital value n and the input voltage VIN becomes large, the difference voltage of the difference signals DS to be input to the A/D conversion circuit 60 becomes large. Then, when the difference voltage exceeds the full-scale range of the A/D conversion circuit 60, there arises a problem that an accurate A/D conversion becomes unachievable. In this regard, in FIG. 16 and FIG. 17, when the voltage difference between the DAC output voltage and the input voltage VIN is large, the feedback control is performed so that the voltage difference between the DAC output voltage and the input voltage VIN decreases due to the integration processing by the integrator 74 and so on, and the DAC input digital values n are output from the control circuit 70. Therefore, it is possible to prevent the situation in which the difference voltage of the difference signals DS increases to exceed the full-scale range of the A/D conversion circuit 60, and it becomes possible to realize the increase in accuracy of the A/D converter 30.

As described hereinabove, in the present embodiment, the control circuit 70 includes the arithmetic circuit 72, the integrator 74, and the quantizer 75, wherein the arithmetic circuit 72 performs the calculation of obtaining d=d1/(d1−d2) based on the ADC output digital values d1, d2, the integrator 74 performs the integration processing on the output of the arithmetic circuit 72, and the quantizer 75 performs the quantization processing on the result of the integration processing to output the DAC input digital values n. In this way, it becomes possible to perform the modulation such as the delta-sigma modulation on the DAC input digital values n. Thus, the DAC input digital value n to the D/A conversion circuit 40 becomes to be prevented from being fixed to a single value, and it is possible to improve the linearity and the differential characteristic of the D/A conversion circuit 40. Further, it becomes possible to autonomously and automatically determine the DAC input digital values n.

Figure 19:
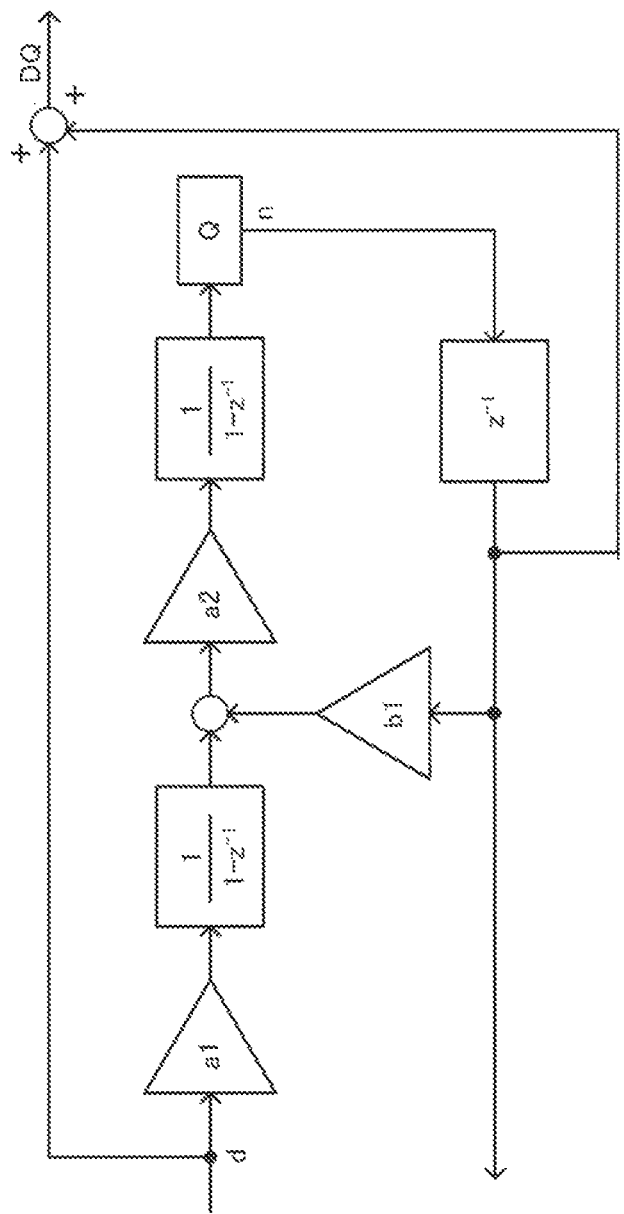
FIG. 19 is a diagram showing a configuration example when performing a modulation corresponding to a second-order delta-sigma modulation.

It should be noted that in a circuit block H1 shown in FIG. 16, the modulation corresponding to a first-order delta-sigma modulation is performed, but the modulation processing in the present embodiment is not limited thereto. There can be adopted a variety of modified implementations such as performing a modulation corresponding to such a second-order delta-sigma modulation as shown in FIG. 19.

Further, the control circuit 70 outputs the DAC input digital value n2 obtained by adding a predetermined value to the DAC input digital value n1. For example, in FIG. 16, the control circuit 70 outputs the DAC input digital value n2 obtained by adding +1 as the predetermined value to the DAC input digital value n1. Here, the predetermined value is not limited to +1, but can be a value no smaller than 2, or can also be a negative value. In this way, by such simple processing as adding the predetermined value, it becomes possible to output the DAC input digital values n1, n2 to the D/A conversion circuit 40, and output the ADC output digital value d1 corresponding to the DAC input digital value n1 and the ADC output digital value d2 corresponding to the DAC input digital value n2 from the A/D conversion circuit 60.

Further, in the present embodiment, it is desirable for the D/A conversion circuit 40 to be the resistor-ladder type D/A conversion circuit. The resistor-ladder type D/A conversion circuit includes a ladder resistor circuit and a switch array. The ladder resistor circuit includes a plurality of resistors disposed in series between a power supply node at a high potential side and a power supply node at a low potential side. The switch array as a voltage selection circuit includes a plurality of switches each set to the ON state or the OFF state with the DAC input digital value n from the control circuit 70. Further, in the switch array, a plurality of divisional voltages from a plurality of divisional voltage nodes of the ladder resistor circuit is input, and the voltage selected by ON/OFF control of the plurality of switches by the DAC input digital value n is output as the output voltage VDAC.

For example, as is obvious from the formulas (1), (2) described above and FIG. 3, when the characteristic of the linearity such as INL (Integral Non-Linearity) of the D/A conversion circuit 40 is poor, the accuracy of the A/D converter 30 deteriorates. For example, the ADC result data DQ can be obtained by the following arithmetic expression as shown in the formula (2) described above, but when the characteristic of the linearity of the D/A conversion circuit is poor, the premise of this arithmetic expression collapses, and it becomes difficult to realize the high-accuracy A/D converter 30.

$$DQ=n1+(n2-n1)\times d1/(d1-d2)$$

In this regard, in the present embodiment, the resistor-ladder type D/A conversion circuit is used as the D/A conversion circuit 40 of the voltage output type. The D/A conversion circuit 40 of the resistor-ladder type performs the D/A conversion based on the ratios of the resistance values of the plurality of resistors in the ladder resistor circuit, and is therefore superior in the characteristic of the linearity such as INL to D/A conversion circuits of other types. For example, by making the layout and so on of the plurality of resistors appropriate, it is possible to realize an excellent characteristic of the linearity. Therefore, by using the resistor-ladder type D/A conversion circuit as the D/A conversion circuit 40, it becomes possible to perform the accurate conversion corresponding to the theoretical formulas (1), (2) described above, and thus, it becomes possible to realize the high-accuracy A/D converter 30.

Further, in the present embodiment, it is desirable to use the successive-approximation type A/D conversion circuit as the A/D conversion circuit 60. By using the successive-approximation type A/D conversion circuit as the A/D conversion circuit 60 as described above, it becomes possible to perform a wideband A/D conversion, and it becomes easy to realize the wideband high-accuracy digital-output temperature sensor 80 compared to when using, for example, a delta-sigma type A/D conversion circuit.

As described above, according to the method of the present embodiment, it is possible to realize the high-accuracy A/D conversion. For example, in the digital-output temperature sensor 80, it is necessary to output a high-accuracy temperature detection result. In this regard, according to the method of the present embodiment, since it becomes possible to perform the A/D conversion having the higher accuracy than the resolution of the A/D conversion circuit 60, it is possible to meet the requirement of the output of such a high-accuracy temperature detection result. Further, in the digital-output temperature sensor 80, it is necessary to output the wideband high-accuracy temperature detection result. According to the method of the present embodiment, since it is easy to widen the bandwidth, it is possible to meet the demand of outputting the wideband high-accuracy temperature detection result.

Figure 20:
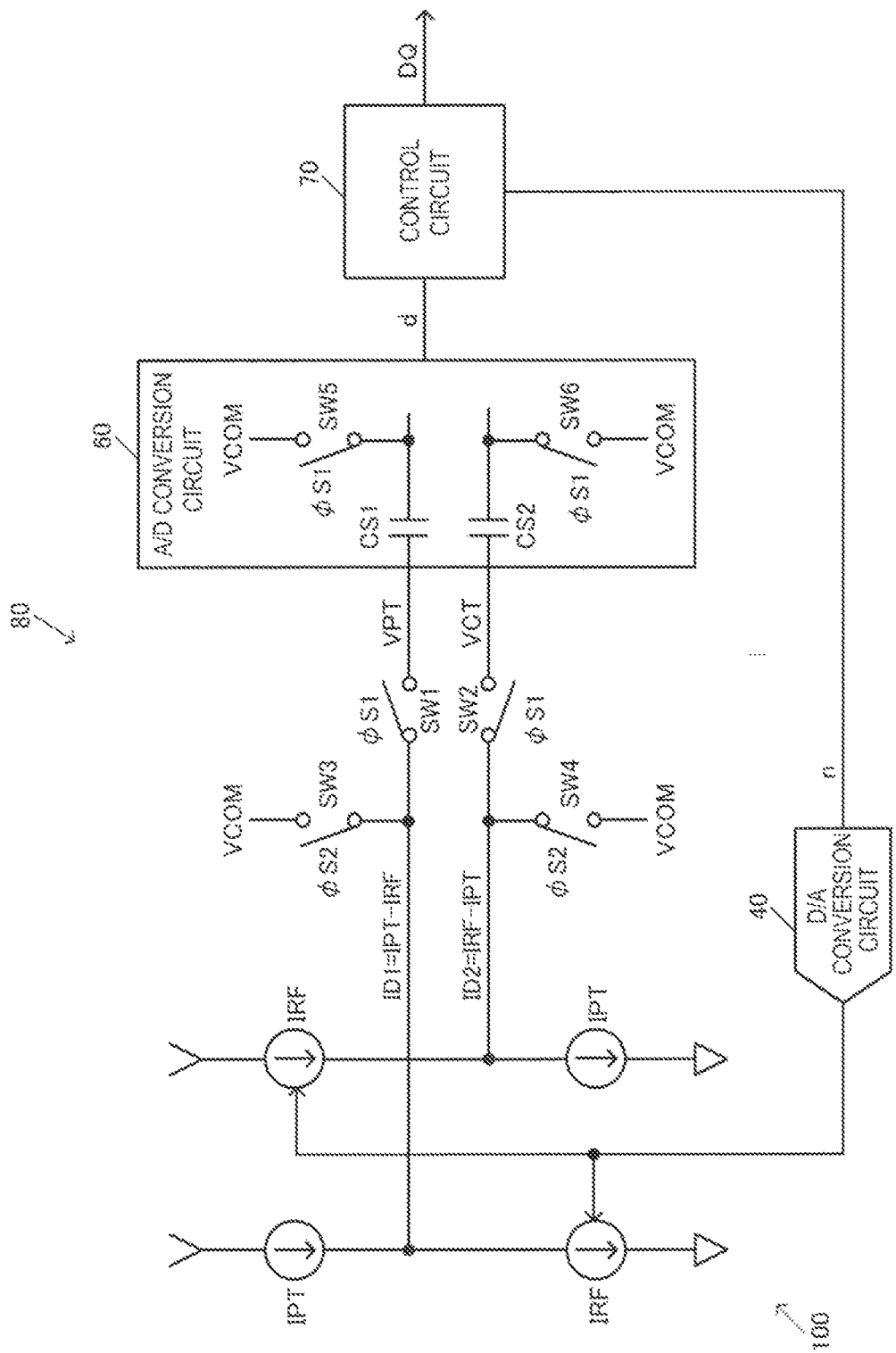
FIG. 20 is a diagram showing a detailed configuration example of the digital-output temperature sensor.
Figure 21:
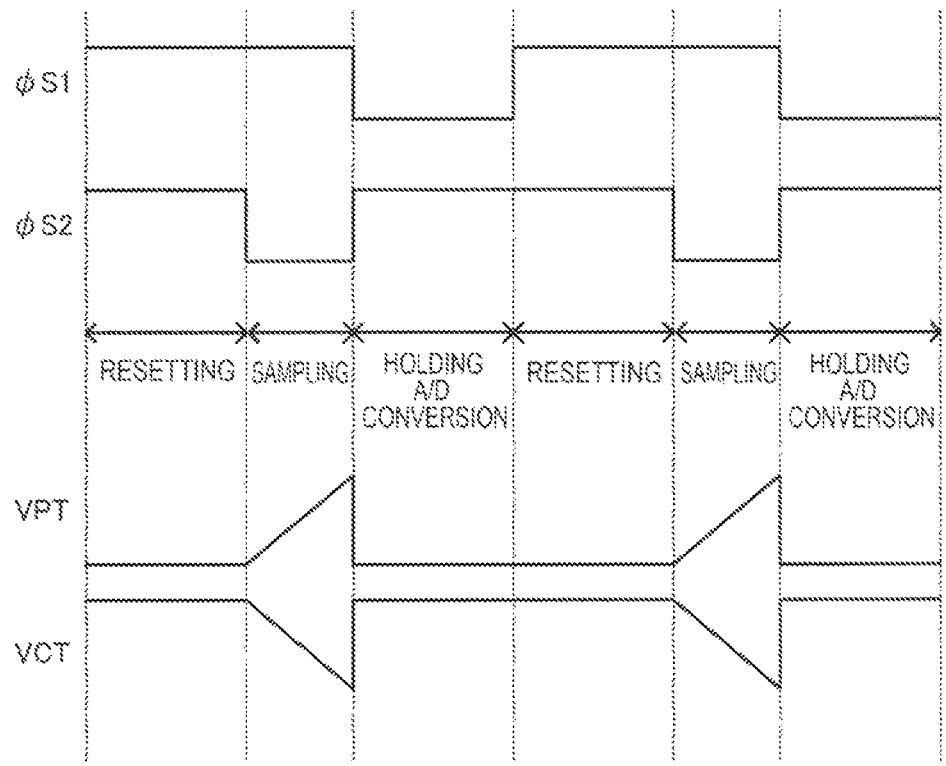
FIG. 21 is a signal waveform chart for explaining an operation of the digital-output temperature sensor.

FIG. 20 shows a detailed configuration example of the digital-output temperature sensor 80 according to the present embodiment, and FIG. 21 shows a signal waveform chart for explaining the operation thereof.

When both of control signals φS1, φS2 become in the H level to be activated, switches SW1, SW2, SW3, SW4, SW5, and SW6 shown in FIG. 20 are set to the ON state, both ends of the capacitors CS1, CS2 for sampling are set to a common voltage VCOM, and thus, reset of the capacitors CS1, CS2 is performed. Then, the control signal φS2 becomes in the L level to be made inactive, the difference currents ID1=IPT−IRF, ID2=IRF−IPT from the current mirror circuit 100 flow into one ends of the capacitors CS1, CS2 via the switches SW1, SW2, respectively, and thus, a sampling operation in which the capacitors CS1, CS2 are charged by the difference currents ID1, ID2 is performed. Thus, a voltage VPT, for example, rises, and a voltage VCT falls with time as shown in FIG. 21. Then, when the control signal φS1 becomes in the L level to be made inactive, a hold operation of the voltages VPT, VCT sampled in the capacitors CS1, CS2 is performed, and the A/D conversion of the voltages VPT, VCT is performed by the A/D conversion circuit 60. As described above, in FIG. 20, the circuit constituted by the switches SW1 through SW6, and the capacitors CS1, CS2 has a function as a current/voltage conversion circuit for converting the difference currents ID1, ID2 into the voltages VPT, VCT, and a function of the amplifier circuit 51 shown in FIG. 14. For example, it becomes possible to set the gain G of the amplifier circuit 51 using the length of the sampling period of the capacitors CS1, CS2.

Figure 22:
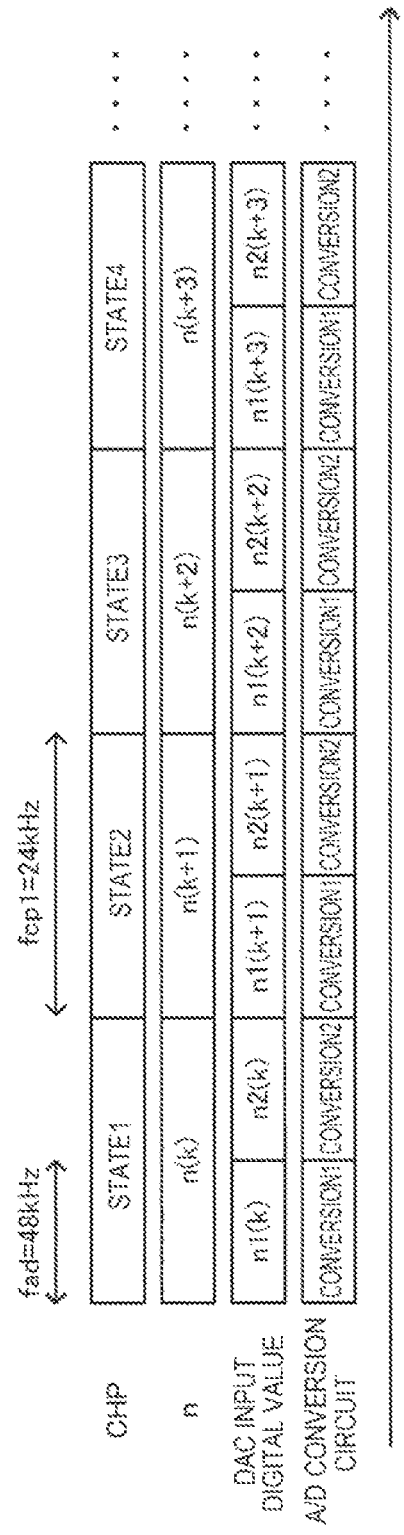
FIG. 22 is an operation explanatory diagram of the digital-output temperature sensor.

FIG. 22 is an operation explanatory diagram of the digital-output temperature sensor 80. A state of the chopping operation is switched between a state 1, a state 2, a state 3, and a state 4. Here, the frequency of the chopping operation is, for example, fcp1=24 kHz. Further, for example, in the state 1 of the chopping operation, the k-th processing described with reference to FIG. 17 is performed, and the control circuit 70 outputs n1(k), n2(k) as the DAC input digital values n(k), and the D/A conversion circuit 40 performs the D/A conversion of n1(k), n2(k). Then, the A/D conversion circuit 60 performs the A/D conversion twice to output d1(k), d2(k) corresponding to n1(k), n2(k) to the control circuit 70, and the control circuit 70 outputs the ADC result data DQ as the temperature detection data. Further, in the state 2 of the chopping operation, the (k+1)-th processing described with reference to FIG. 17 is performed, and the control circuit 70 outputs n1(k+1), n2(k+1) as the DAC input digital values n(k+1), and the D/A conversion circuit 40 performs the D/A conversion of n1(k+1), n2(k+1). Then, the A/D conversion circuit 60 performs the A/D conversion twice to output d1(k+1), d2(k+1) corresponding to n1(k+1), n2(k+1) to the control circuit 70, and the control circuit 70 outputs the ADC result data DQ as the temperature detection data. Substantially the same applies to the operations in the state 3 and the state 4.

In FIG. 22, the conversion frequency of the A/D conversion circuit 60 is fad=48 kHz, and is set, for example, twice as high as the frequency fcp1=24 kHz of the chopping operation. The conversion frequency of the A/D conversion circuit 60 is also called a sampling frequency or a conversion rate. Further, the temperature detection data as the ADC result data DQ becomes to be output from the A/D converter 30 with a period corresponding to fcp1=24 kHz.

For example, when the chopping circuit 110 performs the source side chopping operation and the sink side chopping operation, it is assumed that the conversion frequency of the A/D conversion circuit 60 is fad, the frequency of the source side chopping operation is fcp1, the frequency of the sink side chopping operation is fcp2, and m is an integer no smaller than 2. In this case, in the present embodiment, fad=2×fcp1 is true as shown in, for example, FIG. 22. Here, as described above with reference to FIG. 6, since fcp1=m× fcp2 is true, the following relationship is fulfilled.

$$fad = 2 \times fcp1 = 2 \times (m \times fcp2)$$

For example, in FIG. 6, m=2 is assumed, but m can be 3 or more. Further, as described above, it is possible to arrange that the frequency fcp2 of the sink side chopping operation is higher than the frequency fcp1 of the source side chopping operation, and in this case, the following relationship is fulfilled.

$$fad = 2 \times fcp2 = 2 \times (m \times fcp1)$$

In other words, in the present embodiment, one of the following relationships is fulfilled.

$$fad = 2 \times fcp1 = 2 \times (m \times fcp2)$$

$$fad = 2 \times fcp2 = 2 \times (m \times fcp1)$$

By the relationship of fad=2×fcp1 or fad=2×fcp2 being fulfilled as described above, it becomes possible to perform the chopping operation of the transistors of the current mirror circuit 100 taking the period in which the A/D conversion circuit 60 performs the conversion twice as the period of the chopping operation as shown in FIG. 22. Further, as described above with reference to FIG. 13 through FIG. 19, by the A/D conversion circuit 60 and the D/A conversion circuit 40 performing the conversion twice to output the ADC result data DQ, it is possible to realize the high-accuracy A/D conversion, and thus, it is possible to realize the increase in accuracy of the digital-output temperature sensor 80. Further, as described above, by the relationship of fcp1=m×fcp2 or m×fcp1=fcp2 being fulfilled, it becomes possible to realize the chopping operation of making the temperature detection current IPT and the reference current IRF flow while switching between the temperature detection current IPT and the reference current IRF using a variety of combinations of the transistors for making the source current flow and the transistors for pulling in the sink current. By the chopping operation of making the temperature detection current IPT and the reference current IRF flow while switching between the temperature detection current IPT and the reference current IRF being performed using the variety of combinations of the transistors at the source side and the drain side as described above, the noise such as the 1/f noise generated by the transistors of the current mirror circuit 100 is further prevented from being transmitted to the A/D conversion circuit 60 in the posterior stage, and it becomes possible to realize a further increase in accuracy of the digital-output temperature sensor 80.

3. Circuit Device

Figure 23:
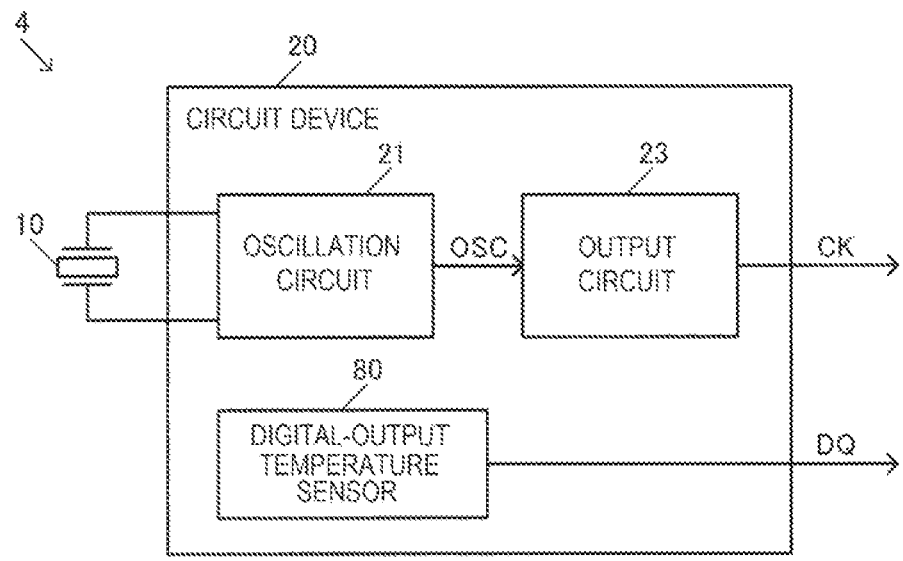
FIG. 23 is diagram showing a first configuration example of a circuit device including the digital-output temperature sensor.

FIG. 23 shows a first configuration example of a circuit device 20 according to the present embodiment. The circuit device 20 includes the digital-output temperature sensor 80 according to the present embodiment, and an oscillation circuit 21 for oscillating a resonator 10. Further, the circuit device 20 can include an output circuit 23 for outputting a clock signal CK based on an oscillation signal OSC from the oscillation circuit 21. Further, an oscillator 4 in the present embodiment includes the resonator 10 and the circuit device 20. The resonator 10 is electrically coupled to the circuit device 20. The resonator 10 and the circuit device 20 are electrically coupled to each other using, for example, internal interconnections of a package for housing the resonator 10 and the circuit device 20, and bonding wires or metal bumps.

The resonator 10 is an element for generating a mechanical vibration due to an electrical signal. The resonator 10 can be realized by a resonator element such as a quartz crystal resonator element. The resonator 10 can be realized by, for example, a quartz crystal resonator element which has a cutting angle of AT-cut or SC-cut, and vibrates in a thickness-shear mode, a tuning-fork quartz crystal resonator element, or a double tuning-fork quartz crystal resonator element. The resonator 10 can be, for example, a resonator incorporated in a temperature-compensated crystal oscillator (TCXO) not equipped with the constant-temperature oven, or a resonator incorporated in an oven-controlled crystal oscillator (OCXO) equipped with a constant-temperature oven. Alternatively, the resonator 10 can be a resonator incorporated in an oscillator such as an SPXO (Simple Packaged Crystal Oscillator). It should be noted that the resonator 10 according to the present embodiment can be realized by a variety of resonator elements such as a resonator element other than the thickness-shear vibration type, the tuning-fork type, or the double tuning-fork type, or a piezoelectric resonator element formed of a material other than quartz crystal. As the resonator 10, it is also possible to adopt, for example, an SAW (Surface Acoustic Wave) resonator, or an MEMS (micro electro-mechanical systems) resonator as a silicon resonator formed using a silicon substrate.

The circuit device 20 is an IC (Integrated Circuit) manufactured using, for example, a semiconductor process, and is a semiconductor chip having circuit elements formed on a semiconductor substrate. In FIG. 23, the circuit device 20 includes the oscillation circuit 21, the output circuit 23, and the digital-output temperature sensor 80.

The oscillation circuit 21 is a circuit for oscillating the resonator 10. The oscillation circuit 21 is electrically coupled to the resonator 10 via, for example, a first terminal and a second terminal for coupling the resonator, and oscillates the resonator 10 to generate the oscillation signal OSC. The first terminal and the second terminal are, for example, pads of the circuit device 20. For example, the oscillation circuit 21 can be realized by a drive circuit for oscillation disposed between the first terminal and the second terminal for coupling the resonator, and passive elements such as a capacitor and a resistor. The drive circuit can be realized by, for example, a COMS inverter circuit or a bipolar transistor. The drive circuit is a core circuit of the oscillation circuit 21, and the drive circuit performs voltage drive or current drive of the resonator 10 to thereby oscillate the resonator 10. As the oscillation circuit 21, there can be used a variety of types of oscillation circuit such as an inverter type, a Pierce type, a Colpitts type, and a Hartley type. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element or the like.

The output circuit 23 outputs the clock signal CK based on the oscillation signal OSC. For example, the output circuit 23 buffers the oscillation signal OSC, and then outputs the oscillation signal OSC to the outside as the clock signal CK. For example, the output circuit 23 outputs the clock signal CK in a single-ended CMOS signal format. It should be noted that it is possible to arrange that the output circuit 23 outputs the clock signal CK in a signal format other than the CMOS format. For example, it is possible for the output circuit 23 to output differential clock signals to the outside in a signal format such as LVDS (Low Voltage Difference signaling), PECL (Positive Emitter Coupled Logic), HCSL (High Speed Current Steering Logic), or differential CMOS (Complementary MOS).

The digital-output temperature sensor 80 detects, for example, the ambient temperature of the resonator 10 to output the ADC result data DQ as the temperature detection data. For example, the digital-output temperature sensor 80 detects the temperature in a surrounding area to thereby detect the ambient temperature of the resonator 10, and then outputs the ADC result data DQ to the outside as the temperature detection data. In this way, it becomes possible to realize the circuit device 20 capable of detecting the ambient temperature of the resonator 10 to output the result as the temperature detection data. It should be noted that in this case, it is possible to arrange to constitute a PLL loop or the like with, for example, an external system to perform a temperature compensation of the oscillation frequency of the resonator 10 based on the temperature detection data to thereby realize the temperature compensation of the clock signal CK.

Figure 24:
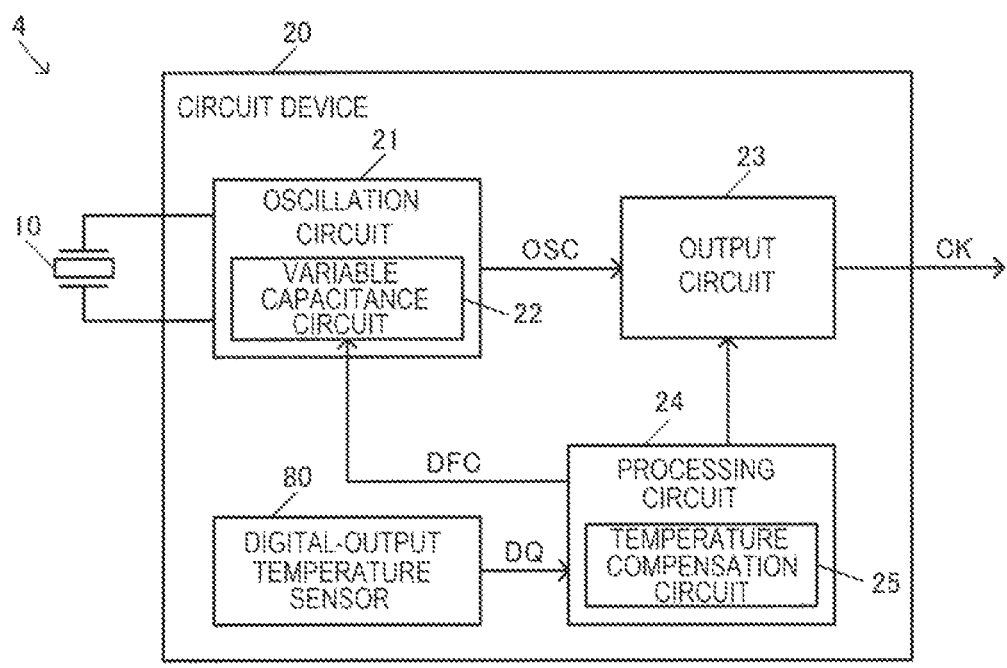
FIG. 24 is diagram showing a second configuration example of the circuit device including the digital-output temperature sensor.

FIG. 24 shows a second configuration example of the circuit device 20. In FIG. 24, the circuit device 20 includes a processing circuit 24 for outputting frequency control data DFC based on the temperature detection data as the ADC result data DQ of the digital-output temperature sensor 80. Further, the oscillation circuit 21 outputs the oscillation signal OSC with the oscillation frequency corresponding to the frequency control data DFC. In this way, it becomes possible to detect the ambient temperature of the resonator 10 with the temperature detection data of the digital-output temperature sensor 80 to control the oscillation frequency of the oscillation circuit 21. It becomes possible to perform the temperature compensation of the oscillation frequency of the resonator 10 to realize, for example, the temperature compensation of the clock signal CK.

Specifically, the processing circuit 24 includes a temperature compensation circuit 25. The temperature compensation circuit 25 performs the temperature compensation process based on the temperature detection data as the ADC result data DQ from the digital-output temperature sensor 80 to output the frequency control data DFC. The temperature compensation process is, for example, processing of suppressing the fluctuation of the oscillation frequency due to the temperature fluctuation to thereby compensate the oscillation frequency. In other words, the temperature compensation circuit 25 performs the temperature compensation process of the oscillation frequency of the oscillation circuit 21 so that the frequency becomes constant even when the temperature fluctuation occurs. For example, the temperature compensation circuit 25 performs the temperature compensation process of obtaining the frequency control data DFC from the temperature detection data using a lookup table representing the correspondence between the temperature detection data and the frequency control data DFC. Specifically, the oscillation circuit 21 includes a variable capacitance circuit 22, and by the capacitance value of the variable capacitance circuit 22 being adjusted based on the frequency control data DFC from the processing circuit 24, the temperature compensation process of the oscillation frequency of the oscillation circuit 21 is realized. Here, the variable capacitance circuit 22 includes, for example, a capacitor array having a plurality of capacitors, and a switch array having a plurality of switches, and pairs of each of the capacitors and corresponding one of the switches are coupled in series between a node of the first terminal or the second terminal for coupling the resonator and, for example, a ground node. Further, capacitance values of the respective capacitors of the capacitor array are binary-weighted. Further, the switches of the switch array are each set to the ON state or the OFF state based on the frequency control data DFC from the processing circuit 24. Thus, the capacitance value of the variable capacitance circuit 22 is controlled to adjust the oscillation frequency of the oscillation circuit 21, and thus, the temperature compensation process is realized.

Figure 25:
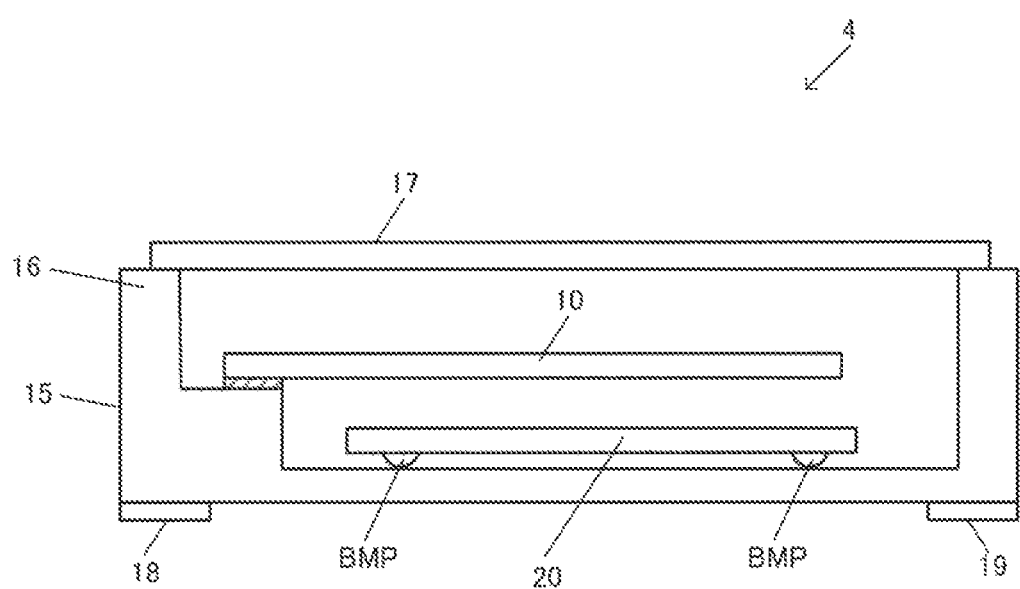
FIG. 25 is a diagram showing a structural example of an oscillator.

FIG. 25 shows a structural example of the oscillator according to the present embodiment. The oscillator 4 according to the present embodiment includes the circuit device 20 and the resonator 10. Specifically, the oscillator 4 has the resonator 10, the circuit device 20, and a package 15 for housing the resonator 10 and the circuit device 20. The package 15 is formed of, for example, ceramics, and has a housing space inside, and the resonator 10 and the circuit device 20 are housed in the housing space. The housing space is airtightly sealed, and is set to a reduced-pressure state, desirably a state approximate to a vacuum state. Due to the package 15, it is possible to protect the resonator 10 and the circuit device 20 from an impact, dust, heat, moisture, and so on in good condition.

The package 15 has a base 16 and a lid 17. Specifically, the package 15 is constituted by the base 16 for supporting the resonator 10 and the circuit device 20, and the lid 17 bonded to an upper surface of the base 16 so that the housing space is formed between the base 16 and the lid 17. Further, the resonator 10 is supported by a step part disposed inside the base 16 via terminal electrodes. Further, the circuit device 20 is disposed on an inner bottom surface of the base 16. Specifically, the circuit device 20 is disposed so that an active surface faces to the inner bottom surface of the base 16. The active surface is a surface on which the circuit elements of the circuit device 20 are formed. Further, bumps BMP are provided to the pads as the terminals of the circuit device 20. Further, the circuit device 20 is supported by the inner bottom surface of the base 16 via the bumps BMP having electrical conductivity. The bumps BMP having electrical conductivity are, for example, metal bumps, and the resonator 10 and the circuit device 20 are electrically coupled to each other via the bumps BMP, internal interconnections and the terminal electrodes of the package 15, and so on. Further, the circuit device 20 is electrically coupled to external terminals 18, 19 as external coupling terminals of the oscillator 4 via the bumps BMP and the internal interconnections of the package 15. The external terminals 18, 19 are formed on an outer bottom surface of the package 15. The external terminals 18, 19 are coupled to an external device via external wiring. The external wiring is, for example, interconnections provided to the circuit board on which the external device is mounted. Thus, it becomes possible to output the clock signal and so on to the external device.

It should be noted that although in FIG. 25, the circuit device 20 is flip-mounted so that the active surface of the circuit device 20 faces downward, the present embodiment is not limited to such a mounting arrangement. It is possible to mount the circuit device 20 so that, for example, the active surface of the circuit device 20 faces upward. In other words, the circuit device 20 is mounted so that the active surface is opposed to the resonator 10. Alternatively, the oscillator 4 can be an oscillator in a wafer-level package (WLP). In this case, the oscillator 4 includes a base having a semiconductor substrate, and through electrodes penetrating the semiconductor substrate between a first surface and a second surface thereof, the resonator 10 fixed to the first surface of the semiconductor substrate via an electrically conductive bonding members such as metal bumps, and external terminals disposed at the second surface side of the semiconductor substrate via an insulating layer such as a relocation wiring layer. Further, an integrated circuit forming the circuit device 20 is formed on the first surface or the second surface of the semiconductor substrate. In this case, a first semiconductor wafer provided with a plurality of bases on which the resonator 10 and the integrated circuit are disposed, and a second semiconductor wafer provided with a plurality of lids are bonded to each other to thereby bond the plurality of bases and the plurality of lids to each other, and then, segmentalization of the oscillators 4 is performed with a dicing saw or the like. In this way, it becomes possible to realize the oscillator 4 in the wafer-level package, and thus, it becomes possible to manufacture the oscillator 4 with high throughput and at low cost.

As described hereinabove, the digital-output temperature sensor according to the present embodiment includes a temperature sensor circuit configured to detect temperature to output a temperature detection current. Further, there is included a current mirror circuit which makes a mirror current of the temperature detection current flow into a first output node as a source current, and pulls in a mirror current of a reference current from the first output node as a sink current to thereby output a first difference current from the first output node, and which makes the mirror current of the reference current flow into a second output node as the source current, and pulls in the mirror current of the temperature detection current from the second output node as the sink current to thereby output a second difference current from the second output node. Further, the digital-output temperature sensor includes a chopping circuit configured to perform a chopping operation on a transistor of the current mirror circuit, and an A/D conversion circuit configured to perform an A/D conversion of the first difference current and the second difference current as a differential pair. Further, the chopping circuit performs the chopping operation of making the mirror current of the reference current flow in a second state through the transistor of the current mirror circuit through which the mirror current of the temperature detection current flows in a first state, and making the mirror current of the temperature detection current flow in the second state through the transistor of the current mirror circuit through which the mirror current of the reference current flows in the first state.

In the present embodiment, the current mirror circuit outputs the first difference current and the second difference current from the first output node and the second output node, respectively, based on the temperature detection current from the temperature sensor circuit and the reference current, and the A/D conversion circuit performs the A/D conversion of the first difference current and the second difference current. Further, the chopping circuit performs the chopping operation of making the mirror current of the reference current flow in the second state through the transistor through which the mirror current of the temperature detection current flows in the first state, and making the mirror current of the temperature detection current flow in the second state through the transistor through which the mirror current of the reference current flows in the first state. In this way, for example, through the transistors targeted for the chopping in the current mirror circuit, the mirror current of the temperature detection current becomes to flow in, for example, the first state, and the mirror current of the reference current becomes to flow in the second state, and through the other transistors targeted for the chopping in the current mirror circuit, the mirror current of the reference current becomes to flow in, for example, the first state, and the mirror current of the temperature detection current becomes to flow in the second state. Therefore, the modulation or the like of the chopping becomes to be performed by switching between the first state, the second state, and so on with the frequency of, for example, the chopping operation, and thus, it becomes possible to achieve reduction of noise.

Further, in the present embodiment, the current mirror circuit may include a first transistor, a second transistor, a third transistor, and a fourth transistor. Further, the chopping circuit may perform a source side chopping operation of switching between a source side first state in which the first transistor makes the mirror current of the temperature detection current flow as the source current, and the second transistor makes the mirror current of the reference current flow as the source current, and a source side second state in which the first transistor makes the mirror current of the reference current flow as the source current, and the second transistor makes the mirror current of the temperature detection current flow as the source current. Further, the chopping circuit may perform a sink side chopping operation of switching between a sink side first state in which the third transistor pulls in the mirror current of the reference current as the sink current, and the fourth transistor pulls in the mirror current of the temperature detection current as the sink current, and a sink side second state in which the third transistor pulls in the mirror current of the temperature detection current as the sink current, and the fourth transistor pulls in the mirror current of the reference current as the sink current.

In this way, due to the source side chopping operation of switching between the source side first state and the source side second state, the transistor for making the temperature detection current flow and the transistor for making the reference current flow become to be switched alternately. Thus, the noise such as the 1/f noise generated in the first transistor and the second transistor at the source side becomes to be modulated into the chopping frequency, and the noise is prevented from being transmitted to the A/D conversion circuit in the posterior stage, and it becomes possible to realize the high-accuracy digital-output temperature sensor. Alternatively, due to the sink side chopping operation of switching between the sink side first state and the sink side second state, the transistor for making the reference current flow and the transistor for making the temperature detection current flow become to be switched alternately. Thus, the noise such as the 1/f noise generated in the third transistor and the fourth transistor at the sink side becomes to be modulated into the chopping frequency, and the noise is prevented from being transmitted to the A/D conversion circuit in the posterior stage, and it becomes possible to realize the high-accuracy digital-output temperature sensor.

Further, in the present embodiment, when the chopping circuit performs the source side chopping operation and the sink side chopping operation, defining a frequency of the source side chopping operation as fcp1, a frequency of the sink side chopping operation as fcp2, and m as an integer no smaller than 2, fcp1=m×fcp2 or m×fcp1=fcp2 may be true.

By the relationship of fcp1=m×fcp2 or m×fcp1=fcp2 being fulfilled as described above, it becomes possible to realize the chopping operation of making the temperature detection current and the reference current flow while switching between the temperature detection current and the reference current using a variety of combinations of the transistors for making the source current flow and the transistors for pulling in the sink current.

Further, in the present embodiment, the chopping circuit may perform the source side chopping operation of switching between the source side first state in which the first transistor makes the mirror current of the temperature detection current flow into the first output node, and the second transistor makes the mirror current of the reference current flow into the second output node, and the source side second state in which the first transistor makes the mirror current of the reference current flow into the second output node, and the second transistor makes the mirror current of the temperature detection current flow into the first output node.

In this way, the modulation of chopping of switching the transistors at the source side for making the temperature detection current and the reference current flow, and the demodulation of chopping of outputting proper first difference current and second difference current from the first output node and the second output node become to be performed, and the noise such as the 1/f noise generated by the transistors of the current mirror circuit becomes to be prevented from being transmitted to the A/D conversion circuit in the posterior stage.

Further, the chopping circuit may perform the sink side chopping operation of switching between the sink side first state in which the third transistor pulls in the mirror current of the reference current from the first output node, and the fourth transistor pulls in the mirror current of the temperature detection current from the second output node, and the sink side second state in which the third transistor pulls in the mirror current of the temperature detection current from the second output node, and the fourth transistor pulls in the mirror current of the reference current from the first output node.

In this way, the modulation of chopping of switching the transistors at the sink side for pulling in the temperature detection current and the reference current, and the demodulation of chopping of outputting proper first difference current and second difference current from the first output node and the second output node become to be performed, and the noise such as the 1/f noise generated by the transistors of the current mirror circuit becomes to be prevented from being transmitted to the A/D conversion circuit in the posterior stage.

Further, in the present embodiment, the current mirror circuit may include a fifth transistor of a P-type a gate of which is coupled to a gate of the first transistor, and a sixth transistor of the P-type a gate of which is coupled to a gate of the second transistor, and the first transistor and the second transistor may be P-type transistors. Further, the chopping circuit couples a gate and a drain of the fifth transistor to a supply node of the temperature detection current, and couples a gate and a drain of the sixth transistor to a supply node of the reference current in the source side first state, and couples the gate and the drain of the fifth transistor to the supply node of the reference current, and couples the gate and the drain of the sixth transistor to the supply node of the temperature detection current in the source side second state.

In this way, it becomes possible to make the mirror current of the temperature detection current flow through the first transistor and at the same time make the mirror current of the reference current flow through the second transistor in the source side first state, and to make the mirror current of the reference current flow through the first transistor and at the same time make the mirror current of the temperature detection current flow through the second transistor in the source side second state.

Further, in the present embodiment, there may further be included a D/A conversion circuit configured to perform a D/A conversion on a DAC input digital value to output the reference current corresponding to the DAC input digital value, and a control circuit configured to output the DAC input digital value. Further, the A/D conversion circuit may perform the A/D conversion on the first difference current and the second difference current as a differential pair to output ADC output digital values. Further, the control circuit may output a first DAC input digital value and a second DAC input digital value different from the first DAC input digital value as the DAC input digital value. Further, the control circuit may obtain the temperature detection data corresponding to the temperature detection current based on a first ADC output digital value as the ADC output digital value obtained in accordance with the first DAC input digital value, a second ADC output digital value as the ADC output digital value obtained in accordance with the second DAC input digital value, and the DAC input digital value.

According to the present embodiment, the A/D conversion based on the first DAC input digital value and the A/D conversion based on the second DAC input digital value are performed. Further, the temperature detection data as the conclusive ADC result data is obtained based on the first ADC output digital value as an A/D conversion result based on the first DAC input digital value, and the second ADC output digital value as an A/D conversion result based on the second DAC input digital value. In this way, it becomes possible to realize the A/D conversion having higher accuracy than the resolution of the A/D conversion circuit using the A/D conversion circuit and the D/A conversion circuit, and thus, it is possible to realize an increase in accuracy of the digital-output temperature sensor.

Further, in the present embodiment, when the chopping circuit performs the source side chopping operation and the sink side chopping operation, defining a conversion frequency of the A/D conversion circuit as fad, a frequency of the source side chopping operation as fcp1, a frequency of the sink side chopping operation as fcp2, and m as an integer no smaller than 2, fad=2×fcp1=2×(m×fcp2) or fad=2×fcp2=2×(m×fcp1) may be true.

By the relationship of fad=2×fcp1 or fad=2×fcp2 being fulfilled as described above, it becomes possible to perform the chopping operation of the current mirror circuit taking the period in which the A/D conversion circuit performs the conversion twice as the period of the chopping operation. Thus, it is possible to realize the high-accuracy A/D conversion, and it is possible to realize the increase in accuracy of the digital-output temperature sensor.

Further, the present embodiment relates to a circuit device including the digital-output temperature sensor described above, and an oscillation circuit configured to oscillate a resonator, wherein the digital-output temperature sensor detects ambient temperature of the resonator to output ADC result data as the temperature detection data.

In this way, it becomes possible to realize the circuit device capable of detecting the ambient temperature of the resonator to output the result as the temperature detection data.

Further, in the present embodiment, there may further be included a processing circuit configured to output frequency control data based on the temperature detection data, wherein the oscillation circuit may generate an oscillation signal with an oscillation frequency corresponding to the frequency control data.

In this way, it becomes possible to detect the ambient temperature of the resonator with the temperature detection data of the digital-output temperature sensor to control the oscillation frequency of the oscillation circuit.

Further, the present embodiment relates to an oscillator including the circuit device described above, and the resonator.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations, the operations, and so on of the digital-output temperature sensor, the circuit device, and the oscillator are not limited to those described in the present embodiment, but can be implemented with a variety of modifications.

What is claimed is:

1. A digital-output temperature sensor comprising:
   a temperature sensor circuit configured to detect temperature to output a temperature detection current;
   a current mirror circuit which is configured to make a mirror current of the temperature detection current flow into a first output node as a source current, and pull in a mirror current of a reference current from the first output node as a sink current to thereby output a first difference current from the first output node, and which is configured to make the mirror current of the reference current flow into a second output node as the source current, and pull in the mirror current of the temperature detection current from the second output node as the sink current to thereby output a second difference current from the second output node;
   a chopping circuit configured to perform a chopping operation on at least one transistor of a plurality of the current mirror circuit; and
   an A/D conversion circuit configured to perform an A/D conversion of the first difference current and the second difference current as a differential pair, wherein
   the chopping circuit is configured to perform the chopping operation of making the mirror current of the reference current flow in a second state through the at least one transistor of the current mirror circuit through which the mirror current of the temperature detection current flows in a first state, and making the mirror current of the temperature detection current flow in the second state through the at least one transistor of the current mirror circuit through which the mirror current of the reference current flows in the first state.

2. The digital-output temperature sensor according to claim 1, wherein
   the plurality of transistors of the current mirror circuit include a first transistor, a second transistor, a third transistor, and a fourth transistor, and
   the chopping circuit is configured to perform at least one of
   a source side chopping operation of switching between a source side first state in which the first transistor makes the mirror current of the temperature detection current flow as the source current, and the second transistor makes the mirror current of the reference current flow as the source current, and a source side second state in which the first transistor makes the mirror current of the reference current flow as the source current, and the second transistor makes the mirror current of the temperature detection current flow as the source current, and
   a sink side chopping operation of switching between a sink side first state in which the third transistor pulls in the mirror current of the reference current as the sink current, and the fourth transistor pulls in the mirror current of the temperature detection current as the sink current, and a sink side second state in which the third transistor pulls in the mirror current of the temperature detection current as the sink current, and the fourth transistor pulls in the mirror current of the reference current as the sink current.

3. The digital-output temperature sensor according to claim 2, wherein
   when the chopping circuit performs the source side chopping operation and the sink side chopping operation,
   defining a frequency of the source side chopping operation as fcp1, a frequency of the sink side chopping operation as fcp2, and m as an integer no smaller than 2,
   fcp1=m×fcp2 or m×fcp1=fcp2 is true.

4. The digital-output temperature sensor according to claim 2, wherein
   the chopping circuit is configured to perform the source side chopping operation of switching between
   the source side first state in which the first transistor makes the mirror current of the temperature detection current flow into the first output node, and the second transistor makes the mirror current of the reference current flow into the second output node, and
   the source side second state in which the first transistor makes the mirror current of the reference current flow into the second output node, and the second transistor makes the mirror current of the temperature detection current flow into the first output node.

5. The digital-output temperature sensor according to claim 2, wherein the chopping circuit is configured to perform the sink side chopping operation of switching between the sink side first state in which the third transistor pulls in the mirror current of the reference current from the first output node, and the fourth transistor pulls in the mirror current of the temperature detection current from the second output node, and the sink side second state in which the third transistor pulls in the mirror current of the temperature detection current from the second output node, and the fourth transistor pulls in the mirror current of the reference current from the first output node.

6. The digital-output temperature sensor according to claim 2, wherein the plurality of transistors of the current mirror circuit further include a fifth transistor of a P-type a gate of which is coupled to a gate of the first transistor, and a sixth transistor of the P-type a gate of which is coupled to a gate of the second transistor, the first transistor and the second transistor are P-type transistors, and the chopping circuit is configured to couple a gate and a drain of the fifth transistor to a supply node of the temperature detection current, and couple a gate and a drain of the sixth transistor to a supply node of the reference current in the source side first state, and couple the gate and the drain of the fifth transistor to the supply node of the reference current, and couple the gate and the drain of the sixth transistor to the supply node of the temperature detection current in the source side second state.

7. The digital-output temperature sensor according to claim 1, further comprising:

a D/A conversion circuit configured to perform a D/A conversion on a DAC input digital value to output the reference current corresponding to the DAC input digital value; and a control circuit configured to output the DAC input digital value, wherein the A/D conversion circuit is configured to perform the A/D conversion on the first difference current and the second difference current as a differential pair to output ADC output digital values, and the control circuit is configured to output a first DAC input digital value and a second DAC input digital value different from the first DAC input digital value as the DAC input digital value, and obtain temperature detection data corresponding to the temperature detection current based on a first ADC output digital value as the ADC output digital value obtained in accordance with the first DAC input digital value, a second ADC output digital value as the ADC output digital value obtained in accordance with the second DAC input digital value, and the DAC input digital value.

8. The digital-output temperature sensor according to claim 2, further comprising:

a D/A conversion circuit configured to perform a D/A conversion on a DAC input digital value to output the reference current corresponding to the DAC input digital value; and a control circuit configured to output the DAC input digital value, wherein the A/D conversion circuit is configured to perform the A/D conversion on the first difference current and the second difference current as a differential pair to output ADC output digital values, and the control circuit is configured to output a first DAC input digital value and a second DAC input digital value different from the first DAC input digital value as the DAC input digital value, and obtain temperature detection data corresponding to the temperature detection current based on a first ADC output digital value as the ADC output digital value obtained in accordance with the first DAC input digital value, a second ADC output digital value as the ADC output digital value obtained in accordance with the second DAC input digital value, the first DAC input digital value, and the second DAC input digital value, and when the chopping circuit performs the source side chopping operation and the sink side chopping operation, defining a conversion frequency of the A/D conversion circuit as fad, a frequency of the source side chopping operation as fcp1, a frequency of the sink side chopping operation as fcp2, and m as an integer no smaller than 2, fad=2×fcp1=2×(m×fcp2) or fad=2×fcp2=2×(m×fcp1) is true.

9. A circuit device comprising:

the digital-output temperature sensor according to claim 1; and an oscillation circuit configured to oscillate a resonator, wherein the digital-output temperature sensor is configured to detect ambient temperature of the resonator to output ADC result data as temperature detection data.

10. The circuit device according to claim 9, further comprising:

a processing circuit configured to output frequency control data based on the temperature detection data, wherein the oscillation circuit is configured to generate an oscillation signal with an oscillation frequency corresponding to the frequency control data.

11. An oscillator comprising:

the circuit device according to claim 9; and the resonator.

* * * * *